(12) United States Patent
Li et al.

(10) Patent No.: US 10,410,714 B2
(45) Date of Patent: Sep. 10, 2019

(54) MULTI-LEVEL CELL (MLC) STATIC RANDOM ACCESS MEMORY (SRAM) (MLC SRAM) CELLS CONFIGURED TO PERFORM MULTIPLICATION OPERATIONS

(71) Applicant: QUALCOMM Incorporated, San Diego, CA (US)

(72) Inventors: Xia Li, San Diego, CA (US); Seung Hyuk Kang, San Diego, CA (US); Venkat Rangan, San Diego, CA (US); Rashid Ahmed Akbar Attar, San Diego, CA (US); Nicholas Ka Ming Stevens-Yu, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 101 days.

(21) Appl. No.: 15/709,709

(22) Filed: Sep. 20, 2017

(65) Prior Publication Data

US 2019/0088309 A1    Mar. 21, 2019

(51) Int. Cl.

| G11C 11/00 | (2006.01) |
|---|---|
| *G11C 11/419* | (2006.01) |
| *G11C 11/56* | (2006.01) |
| *G11C 7/10* | (2006.01) |
| *G11C 8/16* | (2006.01) |
| G11C 11/418 | (2006.01) |

(52) U.S. Cl.
CPC .......... *G11C 11/419* (2013.01); *G11C 7/1006* (2013.01); *G11C 8/16* (2013.01); *G11C 11/565* (2013.01); *G11C 11/418* (2013.01)

(58) Field of Classification Search
CPC .... G11C 11/419; G11C 11/565; G11C 11/418
USPC .......... 365/154, 156, 189.05, 189.08, 230.05
See application file for complete search history.

(56) References Cited

U.S. PATENT DOCUMENTS

| 7,359,275 B1 * | 4/2008 | Wu .......................... G11C 8/16 |
| | | 365/154 |
| 8,370,709 B2 | 2/2013 | Ware |
| | (Continued) | |

OTHER PUBLICATIONS

Hu, Ziang et al., "Optimization of Dense Matrix Multiplication on IBM Cyclops-64: Challenges and Experiences," European Conference on Parallel Processing, Euro-Par '06, 2006, pp. 134-144.

*Primary Examiner* — Connie C Yoha
(74) *Attorney, Agent, or Firm* — Withrow & Terranova, PLLC

(57) ABSTRACT

Multi-level cell (MLC) static random access memory (SRAM) (MLC SRAM) cells configured to perform multiplication operations are disclosed. In one aspect, an MLC SRAM cell includes SRAM bit cells, wherein data values stored in SRAM bit cells correspond to a multiple-bit value stored in the MLC SRAM cell that serves as first operand in multiplication operation. Voltage applied to read bit line is applied to each SRAM bit cell, wherein the voltage is an analog representation of a multiple-bit value that serves as a second operand in the multiplication operation. For each SRAM bit cell, if a particular binary data value is stored, a current correlating to the voltage of the read bit line is added to a current sum line. A magnitude of current on the current sum line is an analog representation of a multiple-bit product of the first operand multiplied by the second operand.

28 Claims, 14 Drawing Sheets

(56) References Cited

U.S. PATENT DOCUMENTS

| | | | | |
|---|---|---|---|---|
| 9,070,477 | B1 * | 6/2015 | Clark | G11C 11/419 |
| 9,432,055 | B2 | 8/2016 | Zhang et al. | |
| 9,524,972 | B2 * | 12/2016 | Mojumder | G11C 8/14 |
| 2010/0332712 | A1 * | 12/2010 | Galbi | G11C 7/1075 |
| | | | | 710/305 |
| 2012/0314486 | A1 | 12/2012 | Yoshimoto et al. | |
| 2017/0040054 | A1 | 2/2017 | Friedman et al. | |
| 2017/0091616 | A1 | 3/2017 | Gokmen et al. | |

* cited by examiner

MULTI-LEVEL CELL (MLC) STATIC RANDOM ACCESS MEMORY (SRAM) (MLC SRAM) CELLS CONFIGURED TO PERFORM MULTIPLICATION OPERATIONS

BACKGROUND

I. Field of the Disclosure

The technology of the disclosure relates generally to static random access memory (SRAM), and particularly to multi-level cell (MLC) SRAM cells configured to perform multiplication operations.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM data array. For any given row in an SRAM data array, each column of the SRAM data array includes an SRAM bit cell in which a single data value or bit is stored. Read and write operations are performed on a particular SRAM bit cell using read and write word lines which correspond to the SRAM bit cell row that includes the particular SRAM bit cell.

Data stored in an SRAM data array can be used for a multitude of operations. For example, artificial intelligence (AI) applications may employ SRAM data arrays to store data used for neural synapse computations. More specifically, neural synapse computations conventionally include performing a series of matrix multiplication operations, because such computations model the propagation of neurons across synapses in neural networks. Thus, data stored in an SRAM data array may correspond to matrices used as operands in such matrix multiplication operations. However, to perform matrix multiplication operations as described above, data stored in an SRAM data array must first be sensed and then provided to a separate multiplication circuit that performs the matrix multiplication operation.

For example, FIG. 1 illustrates an exemplary system 100 that employs a conventional SRAM data array 102, a sense amplifier 104, and a multiplication circuit 106 used to multiply matrix data stored in the SRAM data array 102. In particular, the SRAM data array 102 includes SRAM bit cells 108(1)(1)-108(M)(N) organized into SRAM columns 110(1)-110(N) and SRAM rows 112(1)-112(M). Data may be written to each SRAM bit cell 108(1)(1)-108(M)(N) using a corresponding write circuit 114, control circuit 116, and address decoder circuit 118. For example, data corresponding to a matrix having N columns and M rows may be written to and stored in the SRAM bit cells 108(1)(1)-108(M)(N). To perform a matrix multiplication operation on a matrix stored in the SRAM data array 102, data from each of the SRAM bit cells 108(1)(1)-108(M)(N) is first read using a pre-charge circuit 120 and the sense amplifier 104. The sensed data is then provided to an output buffer circuit 122, which stores the read data until the multiplication circuit 106 is ready to use the read data as an operand in a matrix multiplication operation. Thus, performing a matrix multiplication operation using the system 100 includes first sensing the data in the SRAM data array 102, and then performing the operation using the multiplication circuit 106, wherein each step and related circuitry consumes time, area, and power.

SUMMARY OF THE DISCLOSURE

Aspects disclosed herein include multi-level cell (MLC) static random access memory (SRAM) (MLC SRAM) cells configured to perform multiplication operations. In one aspect, an MLC SRAM cell includes one or more SRAM bit cells, each of which can store a particular binary data value (i.e., either a logic '1' or a logic '0'). Binary data values stored in the SRAM bit cells correspond to a multiple-bit value stored in the MLC SRAM cell, wherein the multiple-bit value serves as a first operand in a multiplication operation performed by the MLC SRAM cell. Each SRAM bit cell includes an input node electrically coupled to a read bit line input node of the MLC SRAM cell which is electrically coupled to a read bit line. Thus, a voltage applied to the read bit line is applied to each SRAM bit cell, wherein the voltage is an analog representation of a multiple-bit value that serves as a second operand in the multiplication operation performed by the MLC SRAM cell. Each SRAM bit cell also includes an output node electrically coupled to a current sum output node of the MLC SRAM cell that is electrically coupled to a current sum line. Additionally, each SRAM bit cell includes a read port configured to electrically couple the input node and the output node of the corresponding SRAM bit cell based on the data value stored in the SRAM bit cell. In this manner, for each SRAM bit cell, if a particular data value is stored in the SRAM bit cell, a current correlating to the voltage of the read bit line is added to the current sum line. As a result, the magnitude of the current on the current sum line is an analog representation of the first operand (e.g., the multiple-bit value stored in the MLC SRAM cell) multiplied by the second operand (e.g., the multiple-bit value corresponding to the voltage applied to the read bit line). Employing the configuration above allows the MLC SRAM cell to perform a multiplication operation, rather than sensing the stored data values and providing the data values to a separate multiplication circuit. Because the MLC SRAM cell can perform a multiplication operation as described above, multiple instances of the MLC SRAM cell can be employed to perform matrix multiplication while consuming less time, area, and power compared to systems that multiply matrices using conventional SRAM data arrays and multiplication circuits.

In this regard in one aspect, an MLC SRAM cell is provided. The MLC SRAM cell comprises a read bit line input node electrically coupled to a read bit line, a current sum output node electrically coupled to a current sum line, and one or more SRAM bit cells. Each SRAM bit cell of the one or more SRAM bit cells comprises a first inverter and a second inverter cross-coupled such that the corresponding SRAM bit cell is configured to store a binary data value. Each SRAM bit cell also comprises an input node electrically coupled to the read bit line input node, and an output node electrically coupled to the current sum output node. Each SRAM bit cell further comprises a read port configured to electrically couple the input node and the output node of the corresponding SRAM bit cell in response to the binary data value stored in the cross-coupled first and second inverters.

In another aspect, a method of using an MLC SRAM cell to multiply a multiple-bit data value stored in the MLC SRAM cell by a multiple-bit value input into the MLC SRAM cell is provided. The method comprises writing a binary data value to each SRAM bit cell of one or more SRAM bit cells of the MLC SRAM cell. A multiple-bit value of the binary data values written to the one or more SRAM bit cells is a first operand determined based on the binary data value stored in each SRAM bit cell. The method further comprises applying a voltage to a read bit line electrically coupled to a read bit line input node of the MLC SRAM cell that is electrically coupled to an input node of each SRAM bit cell of the one or more SRAM bit cells, wherein a magnitude of multiple-bits of the voltage correlates to a second operand. The method further comprises combining currents present on each output node of each SRAM bit cell of the one or more SRAM bit cells onto a current sum output node electrically coupled to a current sum line such that a total current on the current sum line has a magnitude correlating to a multiple-bit product of the first operand and the second operand.

In another aspect, an MLC SRAM matrix array multiplication circuit is provided that comprises a plurality of MLC SRAM cells organized into a plurality of MLC SRAM cell rows and a plurality of MLC SRAM cell columns. Each MLC SRAM cell of the plurality of MLC SRAM cells corresponds to an MLC SRAM cell row and an MLC SRAM cell column. Each MLC SRAM cell comprises a read bit line input node, a current sum output node, and one or more SRAM bit cells. Each SRAM bit cell of the one or more SRAM bit cells comprises a first inverter and a second inverter cross-coupled and configured to store a binary data value, an input node electrically coupled to the read bit line input node of the corresponding MLC SRAM cell, and an output node electrically coupled to the current sum output node of the corresponding MLC SRAM cell. Each SRAM bit cell further comprises a read port configured to electrically couple the input node to the output node of the corresponding SRAM bit cell in response to the binary data value stored in the cross-coupled first and second inverters. The MLC SRAM matrix array multiplication circuit also comprises a plurality of read bit lines, and a plurality of current sum lines. Each read bit line of the plurality of read bit lines corresponds to an MLC SRAM cell column and is electrically coupled to the read bit line input node of each MLC SRAM cell of the corresponding MLC SRAM cell column. Each current sum line of the plurality of current sum lines corresponds to an MLC SRAM cell row and is electrically coupled to the current sum output node of each MLC SRAM cell of the corresponding MLC SRAM cell row.

In another aspect, a method of using an MLC SRAM matrix array multiplication circuit to multiply matrices is provided. The method comprises writing a binary data value to each SRAM bit cell of one or more SRAM bit cells of each MLC SRAM cell of a plurality of MLC SRAM cells organized into a plurality of MLC SRAM cell rows and a plurality of MLC SRAM cell columns. Each MLC SRAM cell of the plurality of MLC SRAM cells corresponds to an MLC SRAM cell row and an MLC SRAM cell column, and a multiple-bit data value stored in each MLC SRAM cell that correlates to a first operand determined based on the data value stored in each SRAM bit cell. The method also comprises applying a plurality of voltages to a corresponding plurality of read bit lines. Each read bit line of the plurality of read bit lines corresponds to an MLC SRAM cell column and is electrically coupled to a read bit line input node of each MLC SRAM cell of the corresponding MLC SRAM cell column that is coupled to an input node of each SRAM bit cell of each corresponding MLC SRAM cell, and a magnitude of each voltage that correlates to a second operand corresponding to a multiple-bit value of an entry in a matrix. The method further comprises, for each iteration of applying the plurality of voltages, combining currents present on each output node of each SRAM bit cell of the one or more SRAM bit cells onto a current sum output node of the corresponding MLC SRAM cell of the corresponding MLC SRAM cell row electrically coupled to a current sum line such that a total current on a corresponding current sum line has a magnitude corresponding to a summation of each multiple-bit product of each corresponding first operand and each corresponding second operand.

DETAILED DESCRIPTION

Figure 1:
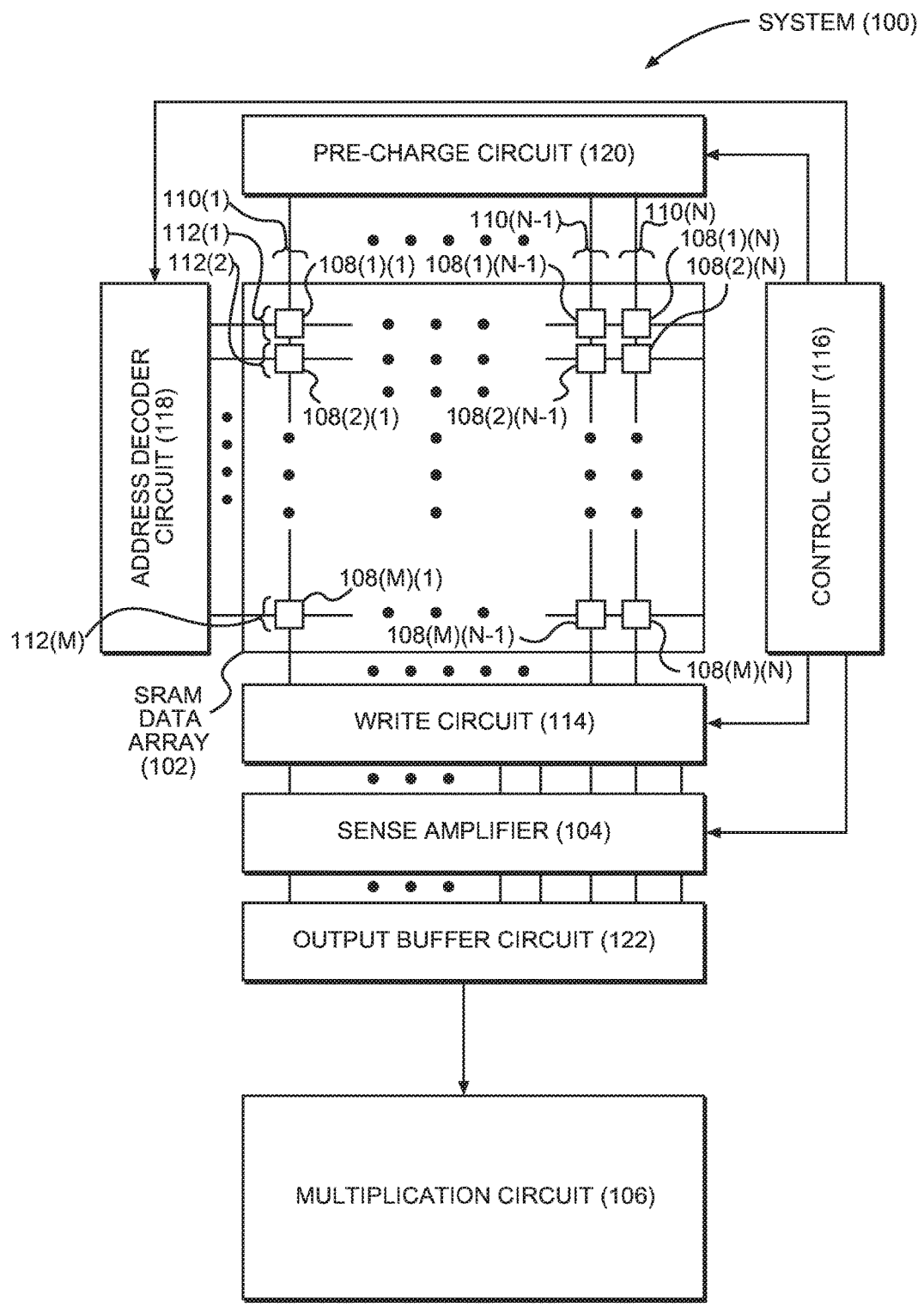
FIG. 1 is a block diagram of an exemplary system that employs a conventional static random access memory (SRAM) data array, a sense amplifier, and a multiplication circuit to multiply matrix data stored in the SRAM data array.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-level cell (MLC) static random access memory (SRAM) (MLC SRAM) cells configured to perform multiplication operations. In one aspect, an MLC SRAM cell includes one or more SRAM bit cells, each of which can store a particular binary data value (i.e., either a logic '1' or a logic '0'). Binary data values stored in the SRAM bit cells correspond to a multiple-bit value stored in the MLC SRAM cell, wherein the multiple-bit value serves as a first operand in a multiplication operation performed by the MLC SRAM cell. Each SRAM bit cell includes an input node electrically coupled to a read bit line input node of the MLC SRAM cell which is electrically coupled to a read bit line. Thus, a voltage applied to the read bit line is applied to each SRAM bit cell, wherein the voltage is an analog representation of a multiple-bit value that serves as a second operand in the multiplication operation performed by the MLC SRAM cell. Each SRAM bit cell also includes an output node electrically coupled to a current sum output node of the MLC SRAM cell that is electrically coupled to a current sum line. Additionally, each SRAM bit cell includes a read port configured to electrically couple the input node and the output node of the corresponding SRAM bit cell based on the data value stored in the SRAM bit cell. In this manner, for each SRAM bit cell, if a particular data value is stored in the SRAM bit cell, a current correlating to the voltage of the read bit line is added to the current sum line. As a result, the magnitude of the current on the current sum line is an analog representation of the first operand (e.g., the multiple-bit value stored in the MLC SRAM cell) multiplied by the second operand (e.g., the multiple-bit value corresponding to the voltage applied to the read bit line). Employing the configuration above allows the MLC SRAM cell to perform a multiplication operation, rather than sensing the stored data values and providing the data values to a separate multiplication circuit. Because the MLC SRAM cell can perform a multiplication operation as described above, multiple instances of the MLC SRAM cell can be employed to perform matrix multiplication while consuming less time, area, and power compared to systems that multiply matrices using conventional SRAM data arrays and multiplication circuits.

Figure 2A:
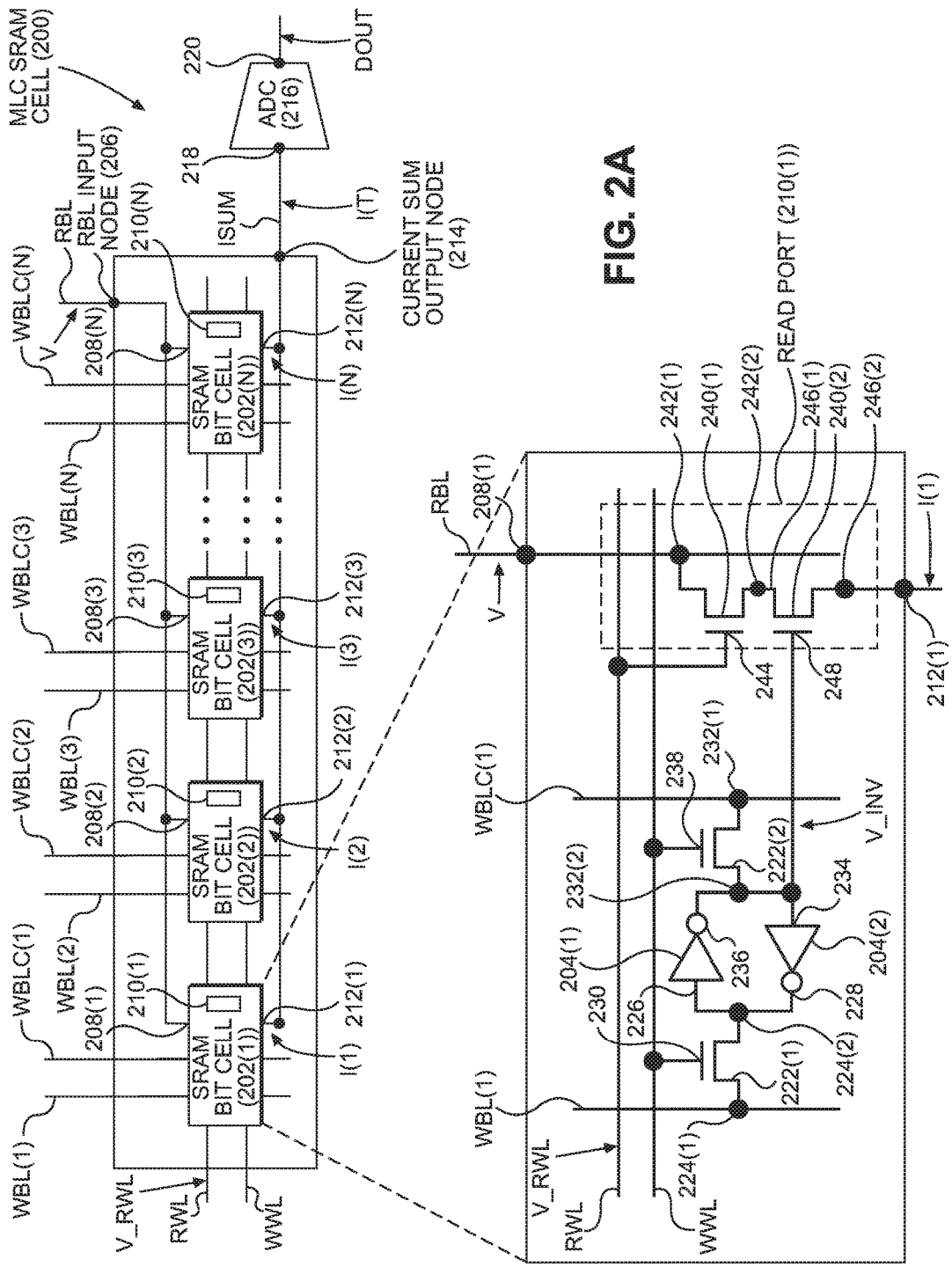
FIG. 2A is a block diagram of an exemplary multi-level cell (MLC) SRAM cell configured to multiply a value stored in the MLC SRAM cell by a value input into the MLC SRAM cell.
Figure 2B:
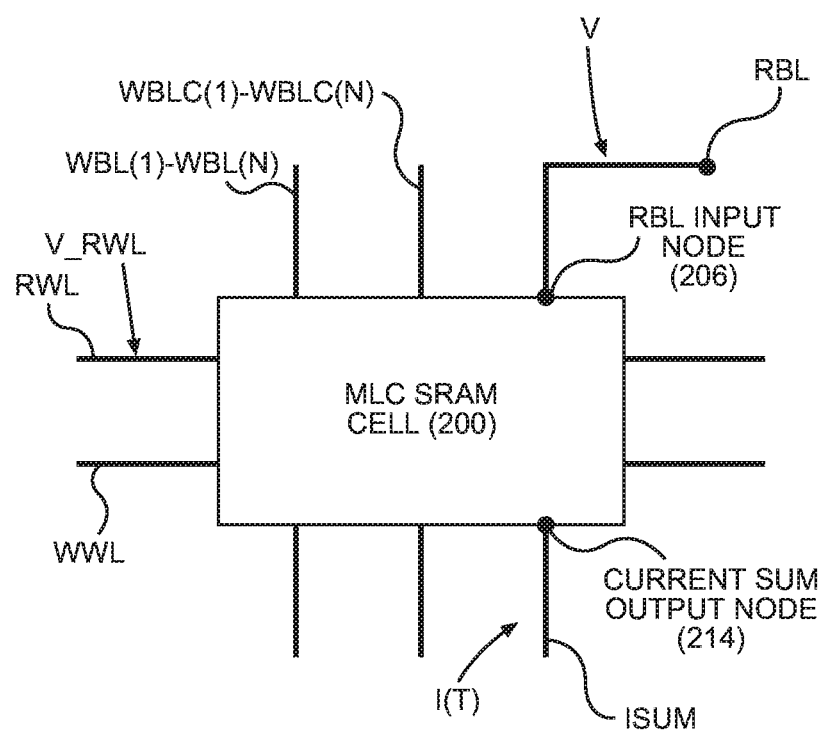
FIG. 2B is a simplified block diagram of the exemplary MLC SRAM cell of FIG. 2A.

In this regard, FIGS. 2A and 2B illustrate an exemplary MLC SRAM cell 200 configured to multiply a value stored in the MLC SRAM cell 200 by a value input into the MLC SRAM cell 200. FIG. 2A is a block diagram of the MLC SRAM cell 200 and illustrates details of SRAM bit cells 202(1)-202(N) that are included in the MLC SRAM cell 200, while FIG. 2B is a block diagram of the MLC SRAM cell 200. As illustrated in FIG. 2A, the MLC SRAM cell 200 includes N SRAM bit cells 202(1)-202(N) such that the MLC SRAM cell 200 is an N-bit MLC SRAM cell 200. Additionally, each of the SRAM bit cells 202(1)-202(N) employs a first inverter 204(1) cross-coupled with a second inverter 204(2) such that the corresponding SRAM bit cell 202(1)-202(N) is configured to store a binary data value (i.e., either a logic '1' or a logic '0'). Binary data values stored in the SRAM bit cells 202(1)-202(N) correspond to a multiple-bit value stored in the MLC SRAM cell 200, wherein the multiple-bit value serves as a first operand in a multiplication operation performed by the MLC SRAM cell 200. The range of multiple-bit values that the MLC SRAM cell 200 may store is determined by the number N of SRAM bit cells 202(1)-202(N). In particular, as described in more detail below, the multiple-bit value (i.e., the N-bit value) stored in the MLC SRAM cell 200 corresponds to the number of SRAM bit cells 202(1)-202(N) that store a logic '0.'

With continuing reference to FIGS. 2A and 2B, the MLC SRAM cell 200 also includes a read bit line (RBL) input node 206 electrically coupled to a read bit line RBL. Additionally, each SRAM bit cell 202(1)-202(N) includes an input node 208(1)-208(N) electrically coupled to the read bit line input node 206 such that a voltage V applied to the read bit line RBL is applied to the input node 208(1)-208(N) of each SRAM bit cell 202(1)-202(N). The voltage V applied to the read bit line RBL is an analog representation of a multiple-bit value that serves as a second operand in the multiplication operation performed by the MLC SRAM cell 200. Each SRAM bit cell 202(1)-202(N) also includes a read port 210(1)-210(N) configured to electrically couple the input node 208(1)-208(N) to an output node 212(1)-212(N) of the corresponding SRAM bit cell 202(1)-202(N) based on the binary data value stored in the SRAM bit cell 202(1)-202(N). Each output node 212(1)-212(N) is electrically coupled to a current sum output node 214 of the MLC SRAM cell 200, which is electrically coupled to a current sum line ISUM. Based on the electrical coupling described above, a current I(T) on the current sum line ISUM is an analog representation of a multiple-bit product of the first operand multiplied by the second operand. In other words, for each SRAM bit cell 202(1)-202(N), if a particular binary data value is stored in the SRAM bit cell 202(1)-202(N), a current I(1)-I(N) correlating to the voltage V of the read bit line RBL is added to the current sum line ISUM via the output node 212(1)-212(N) of each corresponding SRAM bit cell 202(1)-202(N) electrically coupled to the current sum output node 214. As a result, the magnitude of the current I(T) on the current sum line ISUM is an analog representation of the first operand (e.g., the multiple-bit value stored in the MLC SRAM cell 200) multiplied by the second operand (e.g., the multiple-bit value corresponding to the voltage V applied to the read bit line RBL). In this aspect, the current I(T) on the current sum line ISUM is provided to an analog-to-digital converter (ADC) 216 configured to convert the current I(T) of the current sum line ISUM to a digital output value DOUT. In particular, the ADC 216 includes an input node 218 electrically coupled to the current sum line ISUM, and an output node 220 configured to provide the digital output value DOUT.

With continuing reference to FIGS. 2A and 2B, details of the MLC SRAM cell 200 and the corresponding SRAM bit cells 202(1)-202(N) are now provided to clarify how a multiplication operation is performed. In this aspect, in addition to the cross-coupled first and second inverters 204(1), 204(2), each SRAM bit cell 202(1)-202(N) includes a first access transistor 222(1) and a second access transistor 222(2). In this aspect, the first and second access transistors 222(1), 222(2) are both N-type metal-oxide semiconductor (MOS) (NMOS) transistors. In particular, the first access transistor 222(1) includes a first node 224(1) (e.g., a source node) electrically coupled to a corresponding write bit line WBL(1)-WBL(N), a second node 224(2) (e.g., a drain node) electrically coupled to an input node 226 of the first inverter 204(1) and an output node 228 of the second inverter 204(2), and a gate node 230 electrically coupled to a write word line WWL. The second access transistor 222(2) includes a first node 232(1) (e.g., a drain node) electrically coupled to a corresponding complement write bit line WBLC(1)-WBLC(N), a second node 232(2) (e.g., a source node) electrically coupled to an input node 234 of the second inverter 204(1) and an output node 236 of the first inverter 204(1), and a gate node 238 electrically coupled to the write word line WWL. In this manner, a binary data value can be written to each SRAM bit cell 202(1)-202(N) by activating the first and second access transistors 222(1), 222(2) using the write word line WWL, and providing the binary data value via the corresponding write bit line WBL(1)-WBL(N). The complement of the binary data value is provided via the corresponding complement write bit line WBLC(1)-WBLC(N).

With continuing reference to FIGS. 2A and 2B, in this aspect, the read port 210(1)-210(N) of each SRAM bit cell 202(1)-202(N) includes a first transistor 240(1) and a second transistor 240(2). Thus, each SRAM bit cell 202(1)-202(N) is an eight (8) transistor (8T) SRAM bit cell 202(1)-202(N) (i.e., the first and second access transistors 222(1), 222(2), two transistors (not shown) in each of the first and second inverters 204(1), 204(2), and the first and second transistors 240(1), 240(2)). Additionally, in this aspect, the first and second transistors 240(1), 240(2) of each read port 210(1)-210(N) are NMOS transistors. However, as discussed in more detail below, other aspects may include 8T SRAM bit cells 202(1)-202(N) employing NMOS and/or P-type MOS (PMOS) transistors, or seven (7) transistor (7T) SRAM bit cells 202(1)-202(N) employing either NMOS or PMOS transistors.

With continuing reference to FIGS. 2A and 2B, the first transistor 240(1) includes a first node 242(1) (e.g., a drain node) electrically coupled to the input node 208(1)-208(N) of the corresponding SRAM bit cell 202(1)-202(N), a second node 242(2) (e.g., a source node), and a gate node 244 electrically coupled to a read word line RWL. The second transistor 240(2) includes a first node 246(1) (e.g., a drain node) electrically coupled to the second node 242(2) of the first transistor 240(1), a second node 246(2) (e.g., a source node) electrically coupled to the output node 212(1)-212(N) of the corresponding SRAM bit cell 202(1)-202(N), and a gate node 248 electrically coupled to the input node 234 of the second inverter 204(2) and the output node 236 of the first inverter 204(1). Based on the configuration described above, the first transistor 240(1) of the read port 210(1) is activated in response to a voltage V_RWL correlating to a logic '1' applied to the read word line RWL. Additionally, the second transistor 240(2) of the read port 210(1) is activated in response to a voltage V_INV correlating to a logic '1' on the input node 234 of the second inverter 204(2) and the output node 236 of the first inverter 204(1). In other words, the second transistor 240(2) is activated in response to a logic '0' being written to the SRAM bit cell 202(1)-202(N) via the corresponding write bit line WBL(1)-WBL(N), because a logic '0' on the input node 226 of the first inverter 204(1) results in a logic '1' on the output node 236.

With continuing reference to FIGS. 2A and 2B, to perform a multiplication operation of the first operand (i.e., the multiple-bit value stored in the MLC SRAM cell 200) multiplied by the second operand (i.e., the multiple-bit value corresponding to the voltage V applied to the read bit line RBL), a write operation is performed to store a multiple-bit value of the first operand in the MLC SRAM cell 200. For example, if the first operand has a multiple-bit value of three (3) and the MLC SRAM cell 200 includes four (4) SRAM bit cells 202(1)-202(4), then the first operand of three (3) is stored in the MLC SRAM cell 200 by writing a logic '0' to the SRAM bit cells 202(1)-202(3), and writing a logic '1' to the SRAM bit cell 202(4) (e.g., the MLC SRAM cell 200 stores '0001'). Further, if the second operand has a multiple-bit value six (6), then a voltage V that is an analog representation of the multiple-bit value of six (6) is applied to the read bit line RBL. To cause the MLC SRAM cell 200 to multiply the first operand by the second operand, a voltage V_RWL correlating to a logic '1' is applied to the read word line RWL such that the first transistor 240(1) of each SRAM bit cell 202(1)-202(4) is activated. Additionally, a logic '1' is applied to the gate node 248 of the second transistor 240(2) of each SRAM bit cell 202(1)-202(3), which activates the second transistor 240(2) in each SRAM bit cell 202(1)-202(3) such that the input nodes 208(1)-208(3) are electrically coupled to the output nodes 212(1)-212(3).

With continuing reference to FIGS. 2A and 2B, as a result of such coupling, each current I(1)-I(3) generated by the voltage V of the read bit line RBL across the corresponding SRAM bit cells 202(1)-202(3) combines on the current sum output node 214, and thus on the current sum line ISUM. The magnitude of the total current I(T) on the current sum line ISUM is an analog representation of the multiple-bit product of the first operand multiplied by the second operand. Thus, in this example, the magnitude of the total current I(T) on the current sum line ISUM is equivalent to the multiple-bit value eighteen (18) (i.e., 6×3, which is the multiple-bit value of the voltage V on the read bit line RBL multiplied by the number of SRAM bit cells 202(1)-202(3) that electrically couple the read bit line RBL to the current sum line ISUM). Therefore, employing the configuration above allows the MLC SRAM cell 200 to perform a multiplication operation directly, rather than sensing the stored binary data values of the SRAM bit cells 202(1)-202(N) and providing the data to a separate multiplication circuit. As described in detail below, because the MLC SRAM cell 200 can perform a multiplication operation as described above, multiple instances of the MLC SRAM cell 200 can be employed to perform matrix multiplication while consuming less time, area, and power compared to systems that multiply matrices using conventional SRAM data arrays and multiplication circuits.

Figure 3:
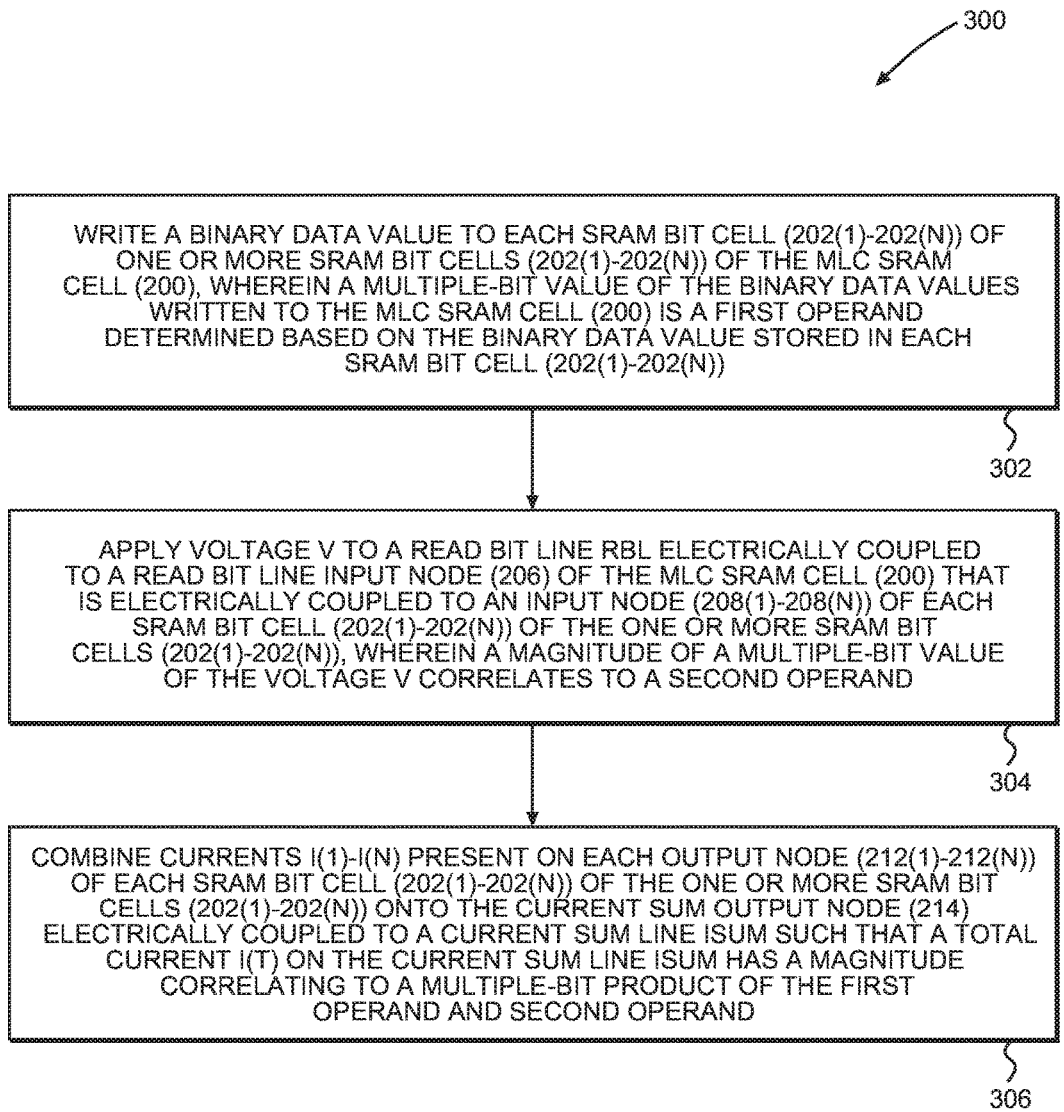
FIG. 3 is a flowchart illustrating an exemplary process for multiplying a value stored in the MLC SRAM cell of FIGS. 2A and 2B by a value input into the MLC SRAM cell.

FIG. 3 illustrates an exemplary process 300 for multiplying a value stored in the MLC SRAM cell 200 of FIGS. 2A and 2B by a multiple-bit value input into the MLC SRAM cell 200. The process 300 includes writing a binary data value to each SRAM bit cell 202(1)-202(N) of the MLC SRAM cell 200 (block 302). As described above, a multiple-bit value of the data values written to the MLC SRAM cell 200 is the first operand determined based on the binary data value stored in each SRAM bit cell 202(1)-202(N). The process 300 also includes applying the voltage V to the read bit line RBL electrically coupled to the read bit line input node 206 of the MLC SRAM cell 200 that is electrically coupled to the input node 208(1)-208(N) of each SRAM bit cell 202(1)-202(N) (block 304). As described above, a magnitude of a multiple-bit value of the voltage V correlates to a second operand of the multiplication operation. The process 300 also includes combining currents I(1)-I(N) present on each output node 212(1)-212(N) of each SRAM bit cell 202(1)-202(N) of the one or more SRAM bit cells 202(1)-202(N) onto the current sum output node 214 electrically coupled to the current sum line ISUM (block 306). As described above, this results in the total current I(T) on the current sum line ISUM having a magnitude corresponding to a multiple-bit product of the first operand and the second operand.

Figure 4A:
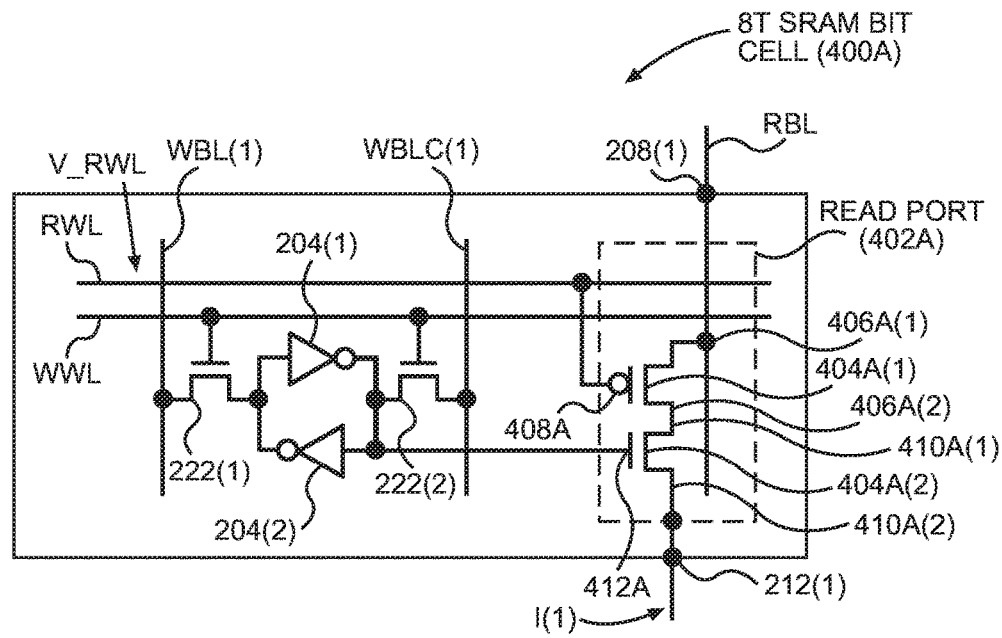
FIG. 4A is a circuit diagram of an exemplary eight (8) transistor (8T) SRAM bit cell employed in the MLC SRAM cell of FIGS. 2A and 2B that includes a read port with one N-type metal-oxide semiconductor (MOS) (NMOS) transistor and one P-type MOS (PMOS) transistor.
Figure 4B:
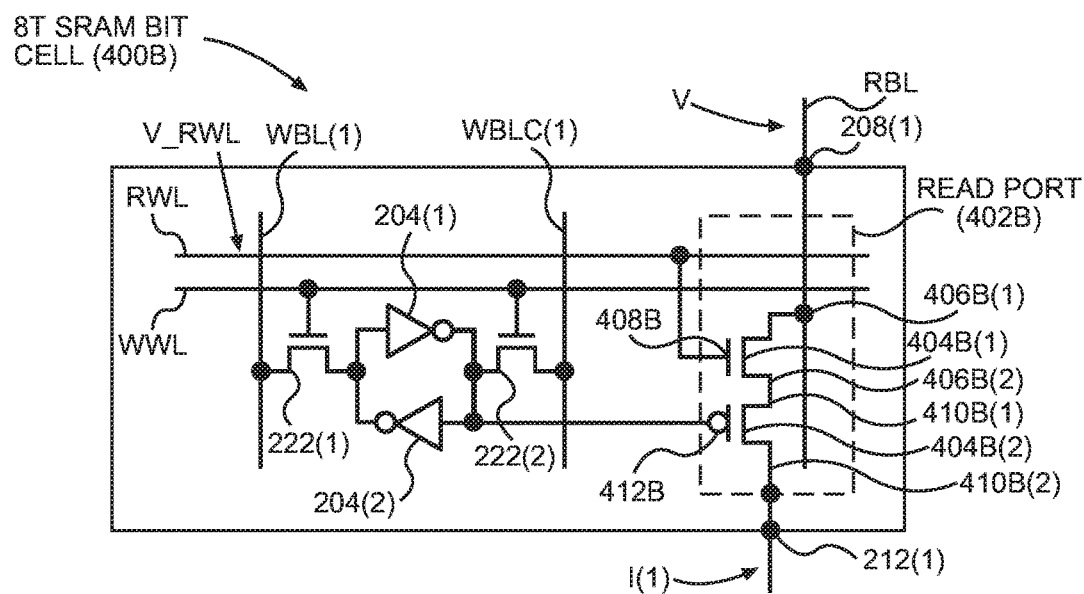
FIG. 4B is a circuit diagram of another exemplary 8T SRAM bit cell that can be employed in the MLC SRAM cell of FIGS. 2A and 2B that includes a read port with one NMOS transistor and one PMOS transistor.
Figure 4C:
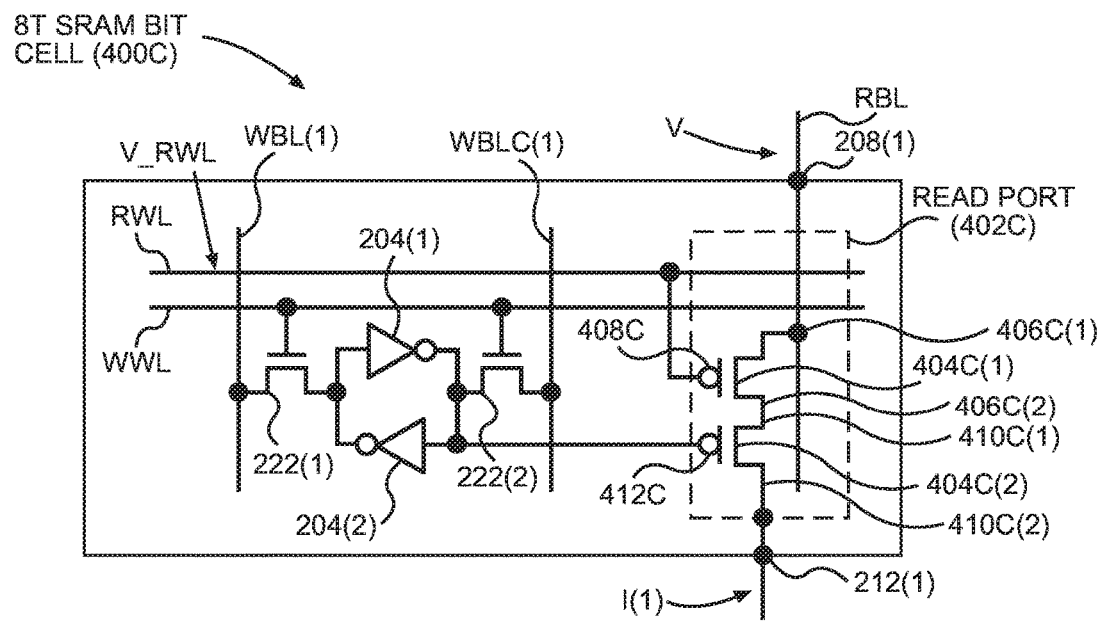
FIG. 4C is a circuit diagram of an exemplary 8T SRAM bit cell that can be employed in the MLC SRAM cell of FIGS. 2A and 2B that includes a read port with two (2) PMOS transistors.

As noted above, the MLC SRAM cell 200 in FIGS. 2A and 2B may employ the SRAM bit cells 202(1)-202(N) with different elements from those described in FIG. 2A. In this regard, FIGS. 4A-4C illustrate circuit diagrams of exemplary 8T SRAM bit cells 400A, 400B, and 400C, respectively, that may be employed by the MLC SRAM cell 200. The SRAM bit cells 400A, 400B, and 400C include common elements with the SRAM bit cells 202(1)-202(N) of FIG. 2A, which are referred to with common element numbers in FIG. 2A and FIGS. 4A-4C, and thus will not be re-described herein. In this regard, the 8T SRAM bit cell 400A in FIG. 4A includes a read port 402A employing a PMOS transistor as a first transistor 404A(1), and an NMOS transistor as a second transistor 404A(2). The first transistor 404A(1) includes a first node 406A(1) (e.g., a source node), a second node 406A(2) (e.g., a drain node), and a gate node 408A. The second transistor 404A(2) includes a first node 410A(1) (e.g., a drain node), a second node 410A(2) (e.g., a source node), and a gate node 412A. Thus, in the 8T SRAM bit cell 400A, a voltage V_RWL correlating to a logic '0' is applied to a read word line RWL to activate the first transistor 404A(1) to perform a multiplication operation, and a logic '0' data value is stored in the 8T SRAM bit cell 400A to increment the binary value of the first operand.

Further, the 8T SRAM bit cell 400B in FIG. 4B includes a read port 402B employing an NMOS transistor as a first transistor 404B(1), and a PMOS transistor as a second transistor 404B(2). The first transistor 404B(1) includes a first node 406B(1) (e.g., a drain node), a second node 406B(2) (e.g., a source node), and a gate node 408B. The second transistor 404B(2) includes a first node 410B(1) (e.g., a source node), a second node 410B(2) (e.g., a drain node), and a gate node 412B. Thus, in the 8T SRAM bit cell 400B, a voltage V_RWL correlating to a logic '1' is applied to a read word line RWL to activate the first transistor 404B(1) to perform a multiplication operation, and a logic '1' data value is stored in the 8T SRAM bit cell 400B to increment the binary value of the first operand.

Additionally, the 8T SRAM bit cell 400C in FIG. 4C includes a read port 402C employing a PMOS transistor as a first transistor 404C(1), and a PMOS transistor as a second transistor 404C(2). The first transistor 404C(1) includes a first node 406C(1) (e.g., a source node), a second node 406C(2) (e.g., a drain node), and a gate node 408C. The second transistor 404C(2) includes a first node 410C(1) (e.g., a source node), a second node 410C(2) (e.g., a drain node), and a gate node 412C. Thus, in the 8T SRAM bit cell 400C, a voltage V_RWL correlating to a logic '0' is applied to a read word line RWL to activate the first transistor 404C(1) to perform a multiplication operation, and a logic '1' is stored in the 8T SRAM bit cell 400C to increment the binary value of the first operand.

Figure 5A:
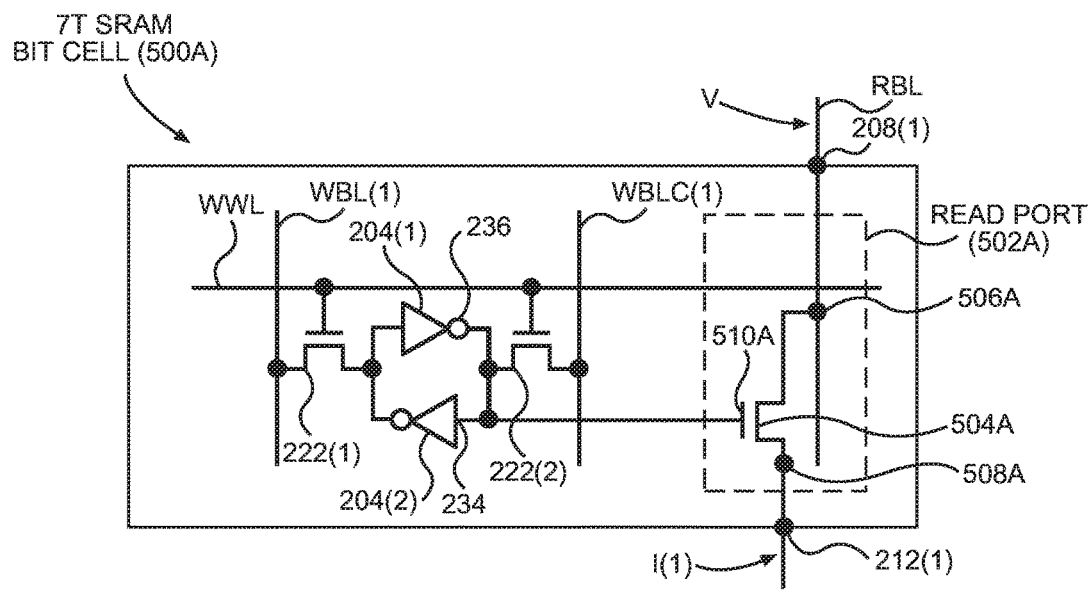
FIG. 5A is a circuit diagram of an exemplary seven (7) transistor (7T) SRAM bit cell that can be employed in the MLC SRAM cell of FIGS. 2A and 2B that includes a read port with one NMOS transistor.
Figure 5B:
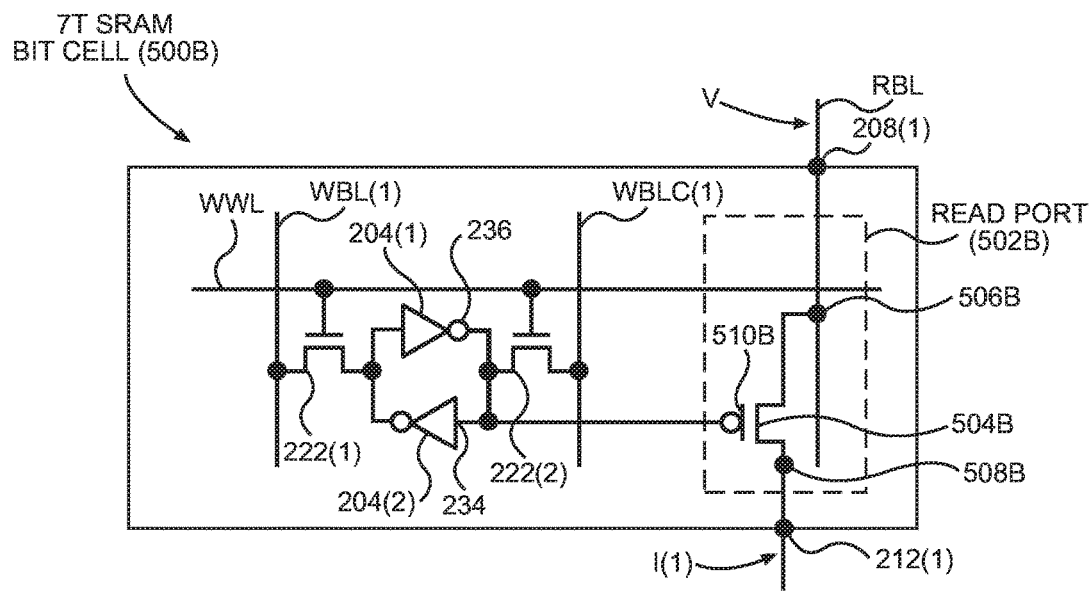
FIG. 5B is a circuit diagram of another exemplary 7T SRAM bit cell that can be employed in the MLC SRAM cell of FIGS. 2A and 2B that includes a read port with one PMOS transistor.

In addition to the 8T SRAM bit cells 400A-400C in FIGS. 4A-4C, the MLC SRAM cell 200 in FIGS. 2A and 2B may employ the SRAM bit cells 202(1)-202(N) formed using seven (7) transistors (i.e., 7T SRAM bit cells). SRAM bit cells 500A and 500B include common elements with the SRAM bit cells 202(1)-202(N) of FIG. 2A, which are referred to with common element numbers in FIG. 2A and FIGS. 5A and 5B, and thus will not be re-described herein. In this regard, FIGS. 5A and 5B illustrates exemplary 7T SRAM bit cells 500A, 500B, respectively, each of which includes a read port 502A, 502B having a single transistor 504A, 504B. In particular, the 7T SRAM bit cell 500A in FIG. 5A includes the read port 502A employing an NMOS transistor for the transistor 504A. The transistor 504A includes a first node 506A (e.g., a drain node) electrically coupled to an input node 208(1), a second node 508A (e.g., a source node) electrically coupled to an output node 212(1), and a gate node 510A electrically coupled to an output node 236 of the first inverter 204(1) of the 7T SRAM bit cell 500A. Thus, a logic '0' data value is stored in the 7T SRAM bit cell 500A to increment the binary value of the first operand. Additionally, the 7T SRAM bit cell 500B in FIG. 5B includes the read port 502B employing a PMOS transistor for the transistor 504B. The transistor 504B includes a first node 506B (e.g., a source node) electrically coupled to an input node 208(1), a second node 508B (e.g., a drain node) electrically coupled to an output node 212(1), and a gate node 510B electrically coupled to an output node 236 of the first inverter 204(1) of the 7T SRAM bit cell 500B. Thus, a logic '1' data value is stored in the 7T SRAM bit cell 500B to increment the binary value of the first operand. Because the 7T SRAM bit cells 500A, 500B only include the single transistor 504A, 504B, respectively, there is no transistor employed for a read word line RWL to activate. Therefore, the MLC SRAM cell 200 employing the 7T SRAM bit cells 500A or 500B may be configured to rely on other indicators, such as a voltage V applied to a read bit line RBL, to initiate a multiplication operation.

Figure 6:
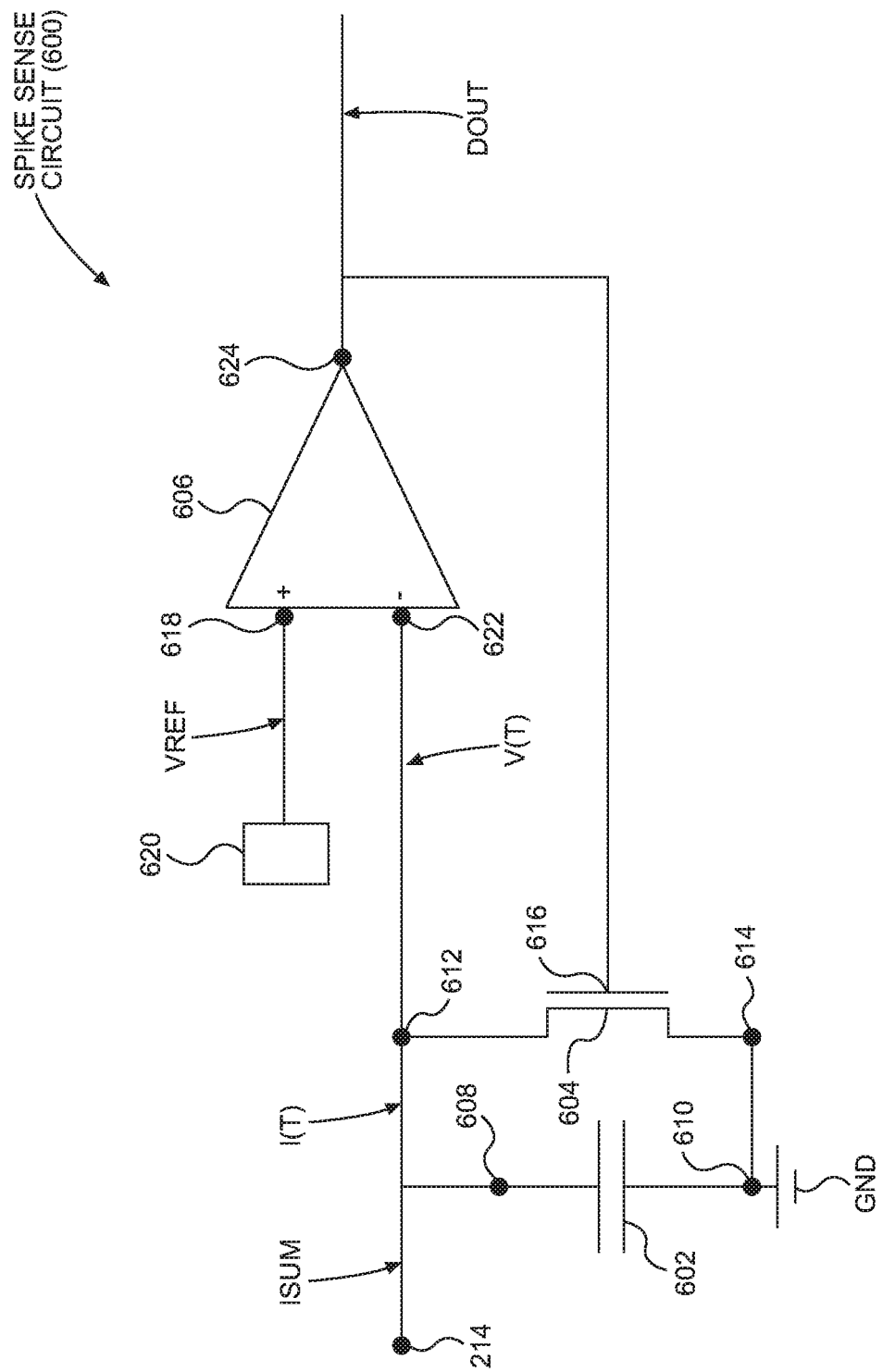
FIG. 6 is a circuit diagram of an exemplary spike sense circuit that can be used to convert an analog output value of the MLC SRAM cell of FIGS. 2A and 2B into a digital output value.

In addition to the ADC 216 in FIGS. 2A and 2B, other circuits may be implemented to convert the total current I(T) on the current sum line ISUM into the digital output value DOUT. In this regard, FIG. 6 illustrates a circuit diagram of an exemplary spike sense circuit 600 that can be used to convert an analog output value (i.e., the total current I(T)) of the MLC SRAM cell 200 of FIGS. 2A and 2B into the digital output value DOUT. In particular, the spike sense circuit 600 includes a capacitor 602, a transistor 604, and a comparator 606. The capacitor 602 includes a first node 608 electrically coupled to the current sum output node 214, and a second node 610 electrically coupled to ground GND. The transistor 604 includes a first node 612 electrically coupled to the current sum output node 214, a second node 614 electrically coupled to the second node 610 of the capacitor 602, and a gate node 616. The comparator 606 includes a first input node 618 electrically coupled to a reference voltage supply 620, a second input node 622 electrically coupled to the current sum output node 214, and an output node 624 electrically coupled to the gate node 616. In this manner, the capacitor 602 functions to convert the total current I(T) on the current sum line ISUM into a corresponding voltage V(T), which is applied to the second input node 622. If the voltage V(T) is greater than a reference voltage VREF of the reference voltage supply 620, then the digital output value DOUT on the output node 624 is a logic '1.' However, if the voltage V(T) is less than the reference voltage VREF, then the digital output value DOUT on the output node 624 is a logic '0.'

Figure 7:
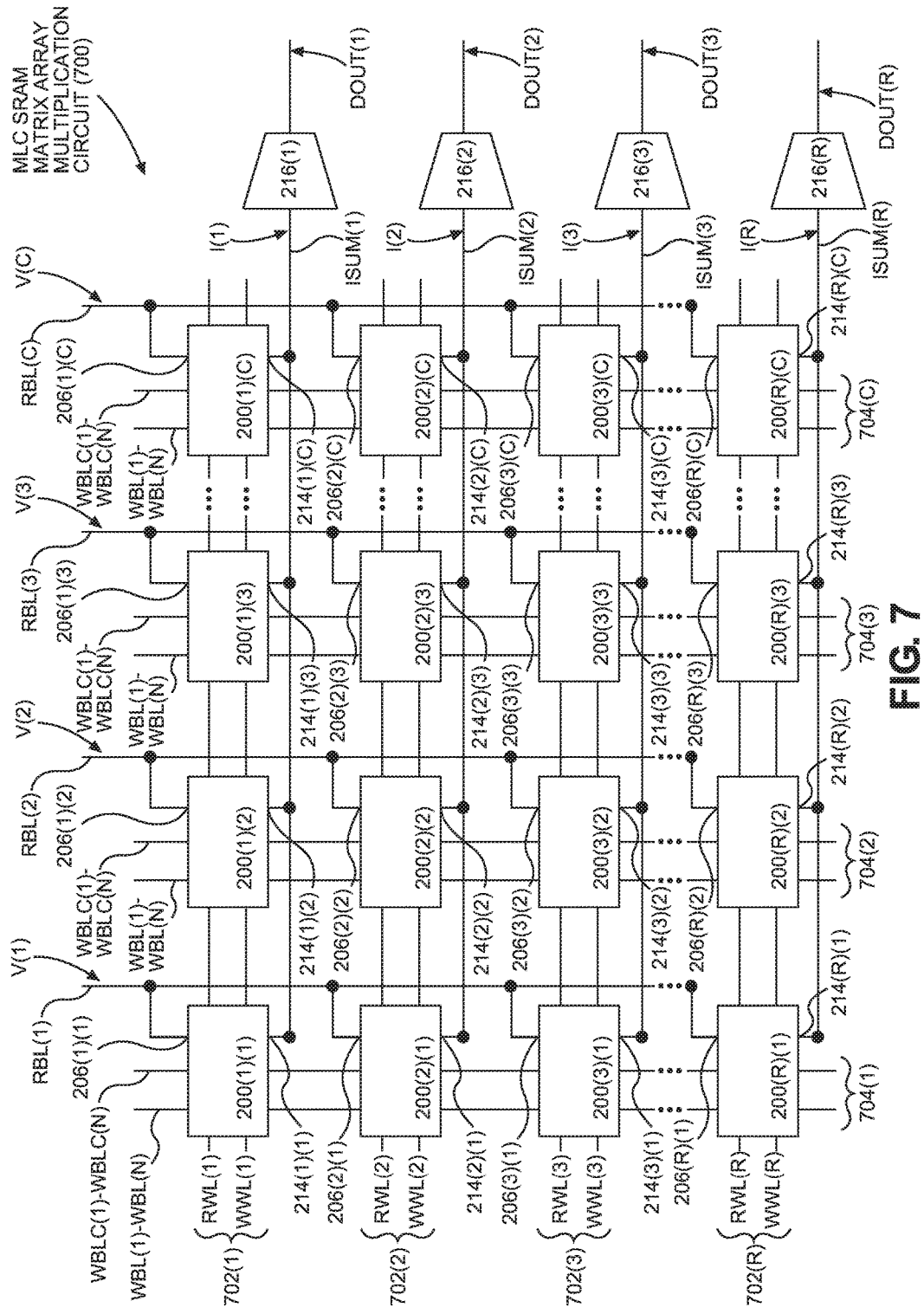
FIG. 7 is a block diagram of an exemplary MLC SRAM matrix array multiplication circuit configured to multiply a matrix stored in SRAM bit cells of the MLC SRAM matrix array multiplication circuit by values input into the MLC SRAM matrix array multiplication circuit.

As referenced above, because the MLC SRAM cell 200 of FIGS. 2A and 2B can directly multiply stored data by a value input into the MLC SRAM cell 200, multiple instances of the MLC SRAM cell 200 can be employed to perform matrix multiplication while consuming less time, area, and power as compared to systems that multiply matrices using conventional SRAM data arrays and multiplication circuits. In this regard, FIG. 7 illustrates a block diagram of an exemplary MLC SRAM matrix array multiplication circuit 700, wherein a matrix array stored in MLC SRAM cells 200(1)(1)-200(R)(C) of the MLC SRAM matrix array multiplication circuit 700 is multiplied by a multiple-bit value correlating to a voltage V(1)-V(C) input into the MLC SRAM matrix array multiplication circuit 700. The MLC SRAM cells 200(1)(1)-200(R)(C) include common elements with the MLC SRAM cell 200 of FIGS. 2A and 2B, which are referred to with common element numbers in FIGS. 2A and 2B, and FIG. 7, and thus will not be re-described herein.

With continuing reference to FIG. 7, in this aspect, the MLC SRAM cells 200(1)(1)-200(R)(C) of the MLC SRAM matrix array multiplication circuit 700 are organized into MLC SRAM cell rows 702(1)-702(R) and MLC SRAM cell columns 704(1)-704(C). Each MLC SRAM cell 200(1)(1)-200(R)(C) corresponds to an MLC SRAM cell row 702(1)-702(R) and MLC SRAM cell column 704(1)-704(C). Each MLC SRAM cell 200(1)(1)-200(R)(C) is configured to store a multiple-bit data value corresponding to a location in the stored matrix, wherein each stored multiple-bit data value serves as a first operand in a matrix multiplication operation. For example, the MLC SRAM cell 200(1)(1) is configured to store the multiple-bit data value of the first MLC SRAM cell row 702(1)/first MLC SRAM cell column 704(1) intersection in the stored matrix array. To store such values, each MLC SRAM cell column 704(1)-704(C) includes write bit lines WBL(1)-WBL(N) and complement write bit lines WBLC(1)-WBLC(N) corresponding to each SRAM bit cell 202(1)-202(N) (not shown) of each corresponding MLC SRAM cell 200(1)(1)-200(R)(C). Further, each MLC SRAM cell row 702(1)-702(R) includes a write word line WWL(1)-WWL(R) used for writing data values to the MLC SRAM cells 200(1)(1)-200(R)(C).

With continuing reference to FIG. 7, voltages V(1)-V(C) corresponding to a second operand for a matrix multiplication operation are applied to read bit lines RBL(1)-RBL(C) of the MLC SRAM matrix array multiplication circuit 700. Each read bit line RBL(1)-RBL(C) corresponds to an MLC SRAM cell column 704(1)-704(C) such that each read bit line RBL(1)-RBL(C) is electrically coupled to a read bit line input node 206(1)(1)-206(R)(C) of each MLC SRAM cell 200(1)(1)-200(R)(C) in the corresponding MLC SRAM cell column 704(1)-704(C). As described in more detail below, configuring the read bit lines RBL(1)-RBL(C) in this manner allows for an independent multiple-bit value correlating to each voltage V(1)-V(C) to be applied to each MLC SRAM cell column 704(1)-704(C) such that a row or column of a corresponding matrix can serve as the second operand in a matrix multiplication operation. Additionally, read word lines RWL(1)-RWL(R) corresponding to each MLC SRAM cell row 702(1)-702(R) are included to perform a matrix multiplication operation, similar to the read word line RWL described with reference to FIGS. 2A and 2B.

With continuing reference to FIG. 7, the MLC SRAM matrix array multiplication circuit 700 also includes current sum lines ISUM(1)-ISUM(R). Each current sum line ISUM( )ISUM(R) corresponds to an MLC SRAM cell row 702(1)-702(R) such that each current sum line ISUM(1)-ISUM(R) is electrically coupled to a current sum output node 214(1)(1)-214(R)(C) of each MLC SRAM cell 200(1)(1)-200(R)(C) in the corresponding MLC SRAM cell row 702(1)-702(R). By configuring each current sum line ISUM(1)-ISUM(R) in this manner, a current I(1)-I(R) on each current sum line ISUM(1)-ISUM(R) is an analog representation of the summation of each multiple-bit product of the first operand stored in each MLC SRAM cell 200(1)(1)-200(R)(C) on each corresponding MLC SRAM cell row 702(1)-702(R) and the second operand applied to each corresponding read bit line RBL(1)-RBL(C). In other words, the current I(1)-I(R) on each current sum line ISUM(1)-ISUM(R) is an analog representation of one entry in a matrix generated by multiplying the multiple-bit data values stored in a corresponding MLC SRAM cell row 702(1)-702(R) by multiple-bit values of voltages V(1)-V(C) input via the read bit line RBL(1)-RBL(C). The current sum output node 214(1)(1)-214(R)(C) of each MLC SRAM cell 200(1)(1)-200(R)(C) on a corresponding MLC SRAM cell row 702(1)-702(R) in this aspect is electrically coupled to a corresponding ADC 216(1)-216(R) such that each current I(1)-I(R) can be expressed as a digital output value DOUT(1)-DOUT(R).

Figure 8:
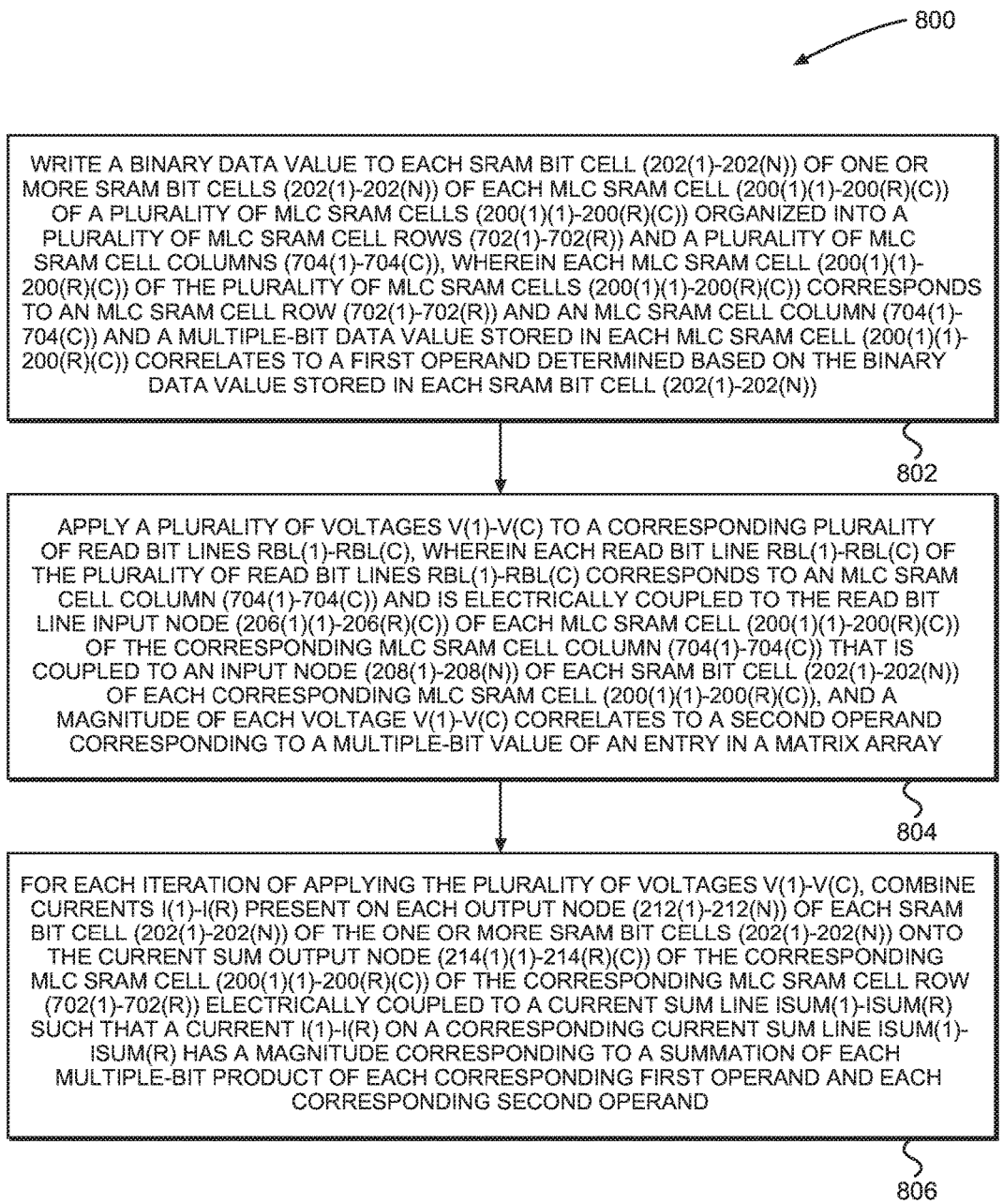
FIG. 8 is a flowchart illustrating an exemplary process for performing matrix array multiplication using the MLC SRAM matrix array multiplication circuit of FIG. 7.

FIG. 8 illustrates an exemplary process 800 for performing a matrix multiplication operation using the MLC SRAM matrix array multiplication circuit 700 of FIG. 7. The process 800 includes writing a binary data value to each SRAM bit cell 202(1)-202(N) of each MLC SRAM cell 200(1)(1)-200(R)(C) organized into a plurality of MLC SRAM cell rows 702(1)-702(R) and a plurality of MLC SRAM cell columns 704(1)-704(C) (block 802). As described above, each MLC SRAM cell 200(1)(1)-200(R)(C) corresponds to an MLC SRAM cell row 702(1)-702(R) and an MLC SRAM cell column 704(1)-704(C), and a multiple-bit data value stored in each MLC SRAM cell 200(1)(1)-200(R)(C) correlates to a multiple-bit value that serves as a first operand determined based on the binary data value stored in each SRAM bit cell 202(1)-202(N). The process 800 also includes applying a plurality of voltages V(1)-V(C) to the corresponding plurality of read bit lines RBL(1)-RBL(C) (block 804). As described above, each read bit line RBL(1)-RBL(C) corresponds to an MLC SRAM cell column 704(1)-704(C), and is electrically coupled to the read bit line input node 206(1)(1)-206(R)(C) of each MLC SRAM cell 200(1)(1)-200(R)(C) of the corresponding MLC SRAM cell column 704(1)-704(C) that is electrically coupled to each input node 208(1)-208(N) of each SRAM bit cell 202(1)-202(N) of each MLC SRAM cell 200(1)(1)-200(R)(C). Further, the magnitude of each voltage V(1)-V(C) correlates to a second operand corresponding to a multiple-bit value of an entry of a matrix array. The process 800 also includes, for each iteration of applying the plurality of voltages V(1)-V(C), combining currents I(1)-I(R) present on each output node 212(1)-212(N) of each SRAM bit cell 202(1)-202(N) of the one or more SRAM bit cells 202(1)-202(N) onto the current sum output node 214(1)(1)-214(R)(C) of the corresponding MLC SRAM cell 200(1)(1)-200(R)(C) of the corresponding MLC SRAM cell row 702(1)-702(R) electrically coupled to the current sum line ISUM(1)-ISUM(R) (block 806). In this manner, the current I(1)-I(R) on each corresponding current sum line ISUM(1)-ISUM(R) has a magnitude corresponding to a summation of each multiple-bit product of each corresponding first operand and each corresponding second operand.

Figure 9:
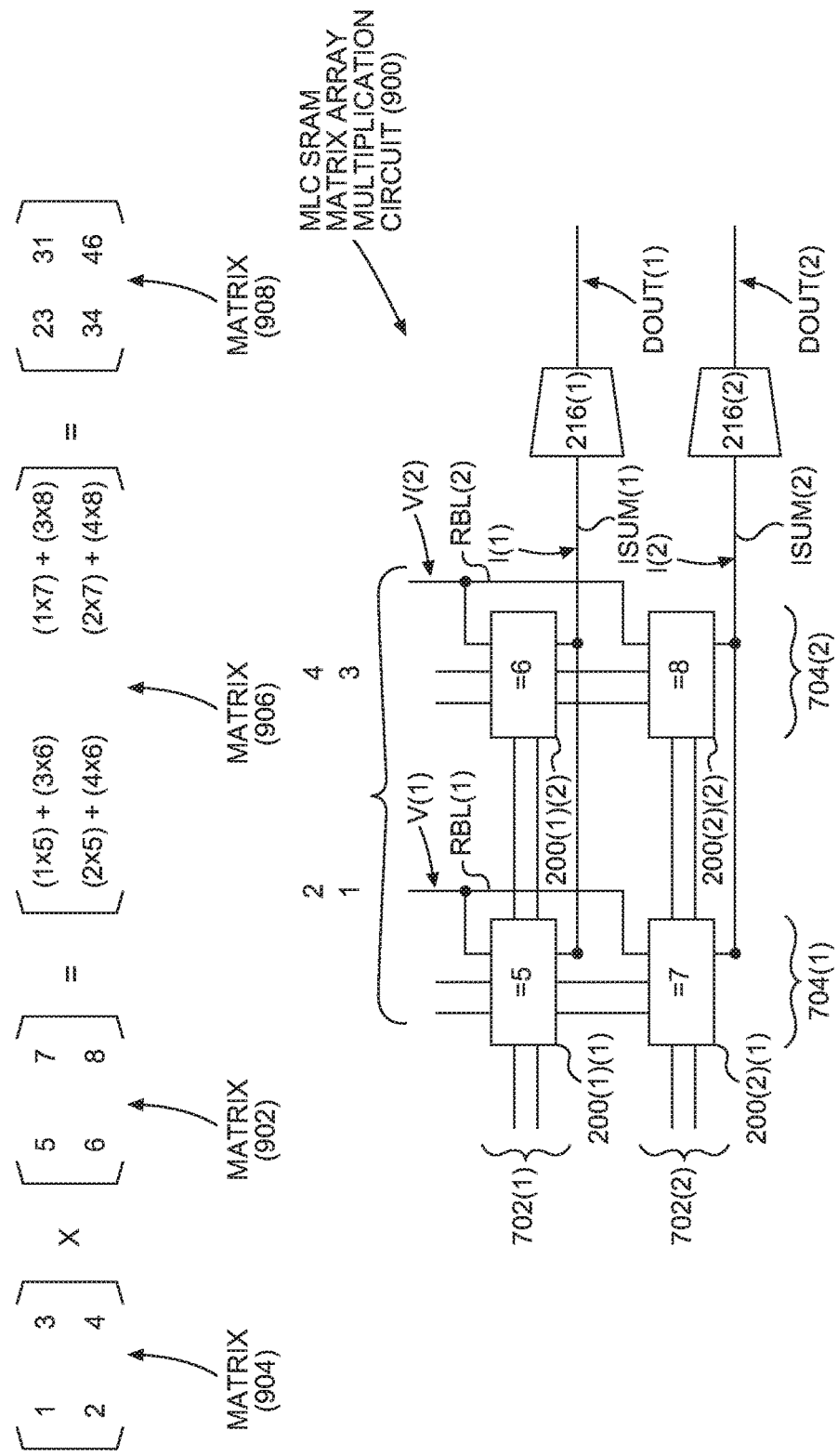
FIG. 9 is a diagram illustrating an exemplary matrix array multiplication operation performed by an exemplary MLC SRAM matrix array multiplication circuit similar to the MLC SRAM matrix array multiplication circuit of FIG. 7.

To provide clarification of performing a matrix multiplication operation using the MLC SRAM matrix array multiplication circuit 700 of FIG. 7, details of an exemplary matrix array multiplication operation are now discussed. In this regard, FIG. 9 illustrates an exemplary MLC SRAM matrix array multiplication circuit 900 similar to the MLC SRAM matrix array multiplication circuit 700 of FIG. 7. The MLC SRAM matrix array multiplication circuit 900 includes common elements with the MLC SRAM matrix array multiplication circuit 700 of FIG. 7, which are referred to with common element numbers in FIG. 7 and FIG. 9, and thus will not be re-described herein. In this regard, the MLC SRAM matrix array multiplication circuit 900 includes MLC SRAM cells 200(1)(1)-200(2)(2) organized into MLC SRAM cell rows 702(1), 702(2) and MLC SRAM cell columns 704(1), 704(2). The MLC SRAM cells 200(1)(1)-200(2)(2) store multiple-bit data values corresponding to a matrix 902. In particular, the MLC SRAM cell 200(1)(1) stores a multiple-bit value five (5), the MLC SRAM cell 200(1)(2) stores a multiple-bit value six (6), the MLC SRAM cell 200(2)(1) stores a multiple-bit value seven (7), and the MLC SRAM cell 200(2)(2) stores a multiple-bit value eight (8). It is assumed that the multiple-bit values above were stored in the MLC SRAM cells 200(1)(1)-200(2)(2) using one or more write operations.

With continuing reference to FIG. 9, to multiply the matrix 902 stored in the MLC SRAM cells 200(1)(1)-200(2)(2) by a matrix 904, voltages V(1), V(2) corresponding to multiple-bit values from the matrix 904 are applied to read bit lines RBL(1), RBL(2) corresponding to the MLC SRAM cell columns 704(1), 704(2) of the MLC SRAM matrix array multiplication circuit 900. In particular, during a first iteration of inputting the voltages V(1), V(2), a multiple-bit value one (1) from a first column/first row entry of the matrix 904 is applied to the read bit line RBL(1) using the voltage V(1), and a multiple-bit value three (3) from a first row/second column entry of the matrix 904 is applied to the read bit line RBL(2) using the voltage V(2). As a result, a magnitude of the current I(1) on the current sum line ISUM(1) is an analog representation of a multiple-bit value twenty-three (23). In particular, applying the voltages V(1), V(2) described above results in the MLC SRAM matrix array multiplication circuit 900 performing the equation ((1×5)+(3×6)), as illustrated in matrix 906, wherein the result of the multiple-bit value twenty-three (23) is illustrated in a first row/first column entry of a matrix 908. Additionally, a magnitude of the current I(2) on the current sum line ISUM(2) is an analog representation of a multiple-bit value thirty-one (31). In particular, applying the voltages V(1), V(2) described above results in the MLC SRAM matrix array multiplication circuit 900 performing the equation ((1×7)+(3×8)), as illustrated in matrix 906, wherein the result of a multiple-bit value thirty-one (31) is illustrated in a first row/second column entry of the matrix 908.

With continuing reference to FIG. 9, during a second iteration of inputting the voltages V(1), V(2), a multiple-bit value two (2) from a second row/first column entry of the matrix 904 is applied to the read bit line RBL(1), and a multiple-bit value four (4) from a second row/second column entry of the matrix 904 is applied to the read bit line RBL(2). As a result, the magnitude of the current I(1) on the current sum line ISUM(1) is an analog representation of a multiple-bit value thirty-four (34). In particular, applying the voltages V(1), V(2) described above results in the MLC SRAM matrix array multiplication circuit 900 performing the equation ((2×5)+(4×6)), as illustrated in the matrix 906, wherein the result of a multiple-bit value thirty-four (34) is illustrated in a second row/first column entry of the matrix 908. Additionally, the magnitude of the current I(2) on the current sum line ISUM(2) is an analog representation of a multiple-bit value forty-six (46). In particular, applying the voltages V(1), V(2) described above results in the MLC SRAM matrix array multiplication circuit 900 performing the equation ((2×7)+(4×8)), as illustrated in matrix 906, wherein the result multiple-bit value forty-six (46) is illustrated in a second row/second column entry of the matrix 908. Further, ADCs 216(1), 216(2) are electrically coupled to the corresponding current sum output nodes 214(1)(1), 214(2)(2) (not shown) such that the corresponding currents I(1), I(2) may be converted into digital output values DOUT(1), DOUT(2), as previously described with reference to FIGS. 2A and 2B.

With continuing reference to FIG. 9, in summary, during the first iteration of applying voltages V(1), V(2), the MLC SRAM matrix array multiplication circuit 900 multiplies the first operand stored in the MLC SRAM cells 200(1)(1), 200(1)(2) by the second operand applied to the corresponding read bit lines RBL(1), RBL(2), and adds the products together on the current sum line ISUM(1). Additionally during the first iteration of applying voltages V(1), V(2), the MLC SRAM matrix array multiplication circuit 900 multiplies the first operand stored in the MLC SRAM cells 200(2)(1), 200(2)(2) by the second operand applied to the corresponding read bit lines RBL(1), RBL(2), and adds the products together on the current sum line ISUM(2). The MLC SRAM matrix array multiplication circuit 900 performs similar functions for the second operands applied during the second iteration of inputting the voltages V(1), V(2). In this manner, the MLC SRAM matrix array multiplication circuit 900 performs matrix multiplication of the matrices 902, 904 to calculate the matrix 908 without employing sense circuits or multiplication circuits in addition to the MLC SRAM cells 200(1)(1)-200(2)(2).

Figure 10:
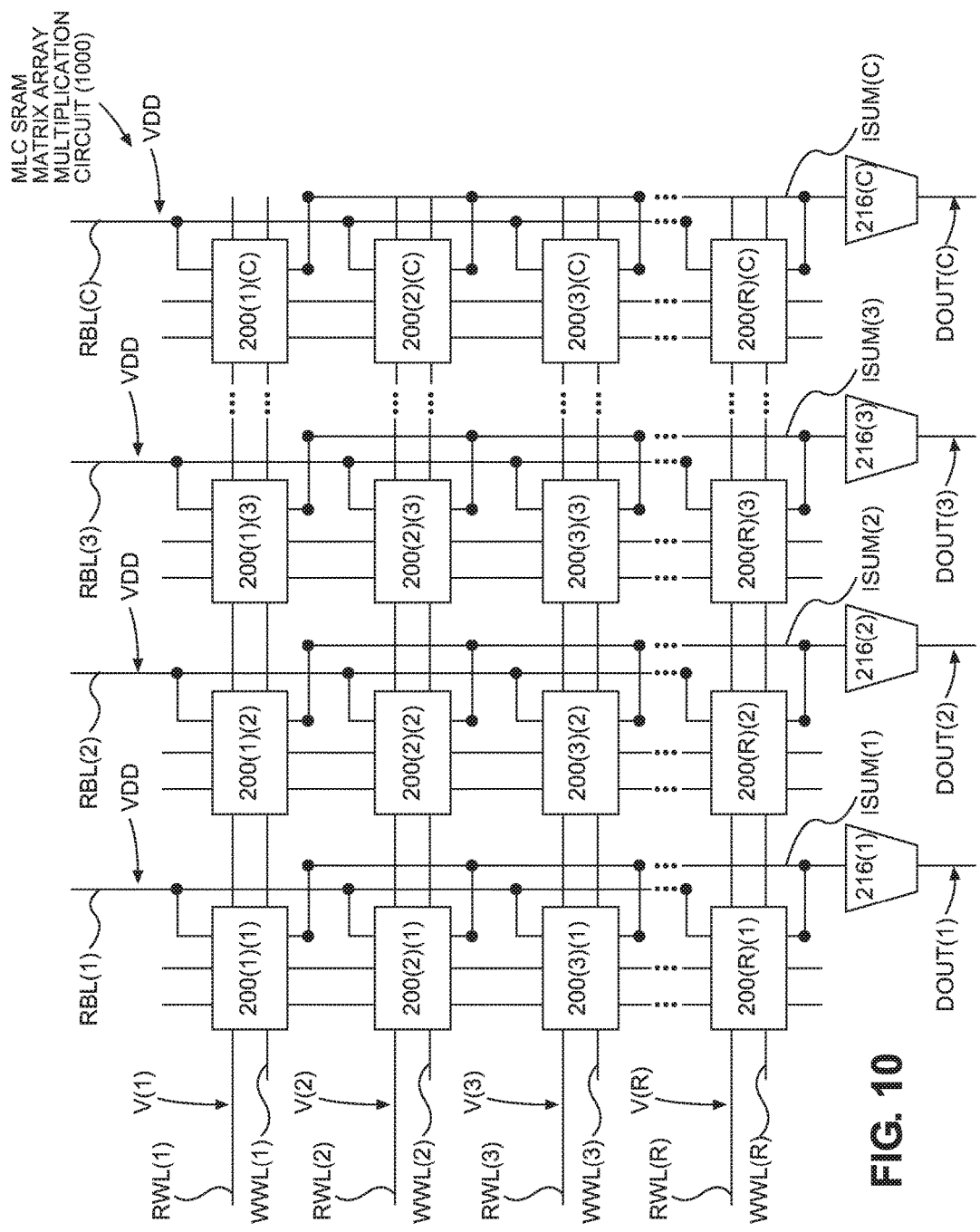
FIG. 10 is block diagram of another exemplary MLC SRAM matrix array multiplication circuit.

FIG. 10 illustrates a block diagram of another exemplary MLC SRAM matrix array multiplication circuit 1000. The MLC SRAM matrix array multiplication circuit 1000 includes common elements with the MLC SRAM matrix array multiplication circuit 700 of FIG. 7, which are referred to with common element numbers in FIG. 7 and FIG. 10, and thus will not be re-described herein. Rather than inputting the voltages V(1)-V(C) (i.e., the second operands) via the read bit lines RBL(1)-RBL(C) similar to the MLC SRAM matrix array multiplication circuit 700 in FIG. 7, the MLC SRAM matrix array multiplication circuit 1000 inputs voltages V(1)-V(C) via corresponding read word lines RWL(1)-RWL(R). Further, a supply voltage VDD is applied to the read bit lines RBL(1)-RBL(C). Additionally, current sum lines ISUM(1)-ISUM(C) correspond to MLC SRAM cell columns 704(1)-704(C) rather than to MLC SRAM cell rows 702(1)-702(R) as in the MLC SRAM matrix array multiplication circuit 700 in FIG. 7. The current sum lines ISUM(1)-ISUM(C) are electrically connected to ADCs 216(1)-216(C) to generate digital output values DOUT(1)-DOUT(C). Such configuration differences between FIG. 7 and FIG. 10 do not alter the output of the MLC SRAM matrix array multiplication circuits 700, 1000, but rather offer designers different implementations that may be selected base on various design considerations.

The MLC SRAM cells configured to perform multiplication operations according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
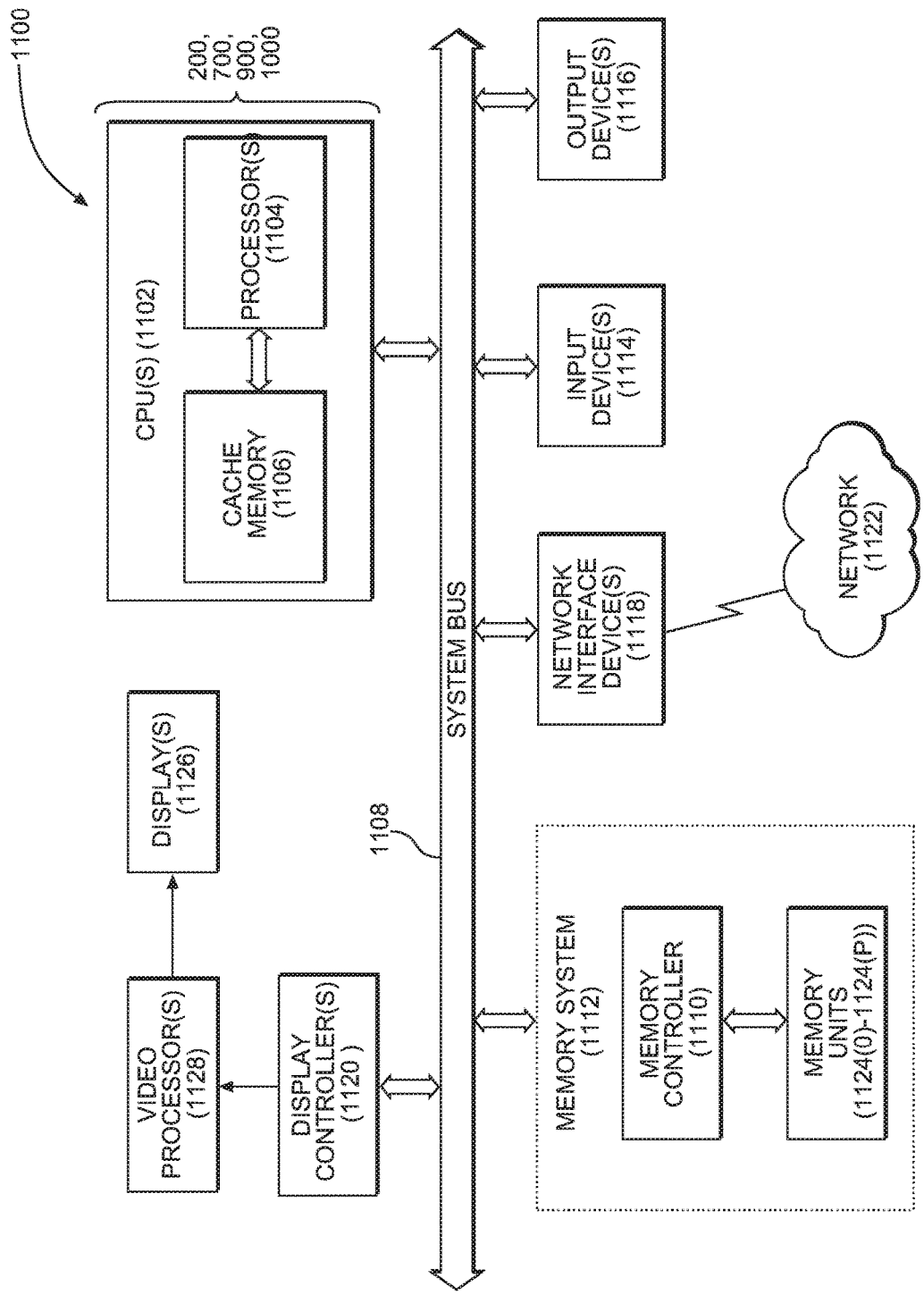
FIG. 11 is a block diagram of an exemplary processor-based system that can include elements employing the MLC SRAM cell of FIGS. 2A and 2B, and/or the MLC SRAM matrix array multiplication circuits of FIGS. 7, 9, and 10.

In this regard, FIG. 11 illustrates an example of a processor-based system 1100 that can include elements employing the MLC SRAM cell 200 of FIGS. 2A and 2B, and the MLC SRAM matrix array multiplication circuits 700, 900, and 1000 of FIGS. 7, 9, and 10, respectively. In this example, the processor-based system 1100 includes one or more central processing units (CPUs) 1102, each including one or more processors 1104. The CPU(s) 1102 may have cache memory 1106 coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112, one or more input devices 1114, one or more output devices 1116, one or more network interface devices 1118, and one or more display controllers 1120, as examples. The input device(s) 1114 can include any type of input device, including, but not limited to, input keys, switches, voice processors, etc. The output device(s) 1116 can include any type of output device, including, but not limited to, audio, video, other visual indicators, etc. The network interface device(s) 1118 can be any device configured to allow exchange of data to and from a network 1122. The network 1122 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1118 can be configured to support any type of communications protocol desired. The memory system 1112 can include one or more memory units 1124(0)-1124(P).

The CPU(s) 1102 may also be configured to access the display controller(s) 1120 over the system bus 1108 to control information sent to one or more displays 1126. The display controller(s) 1120 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc.

Figure 12:
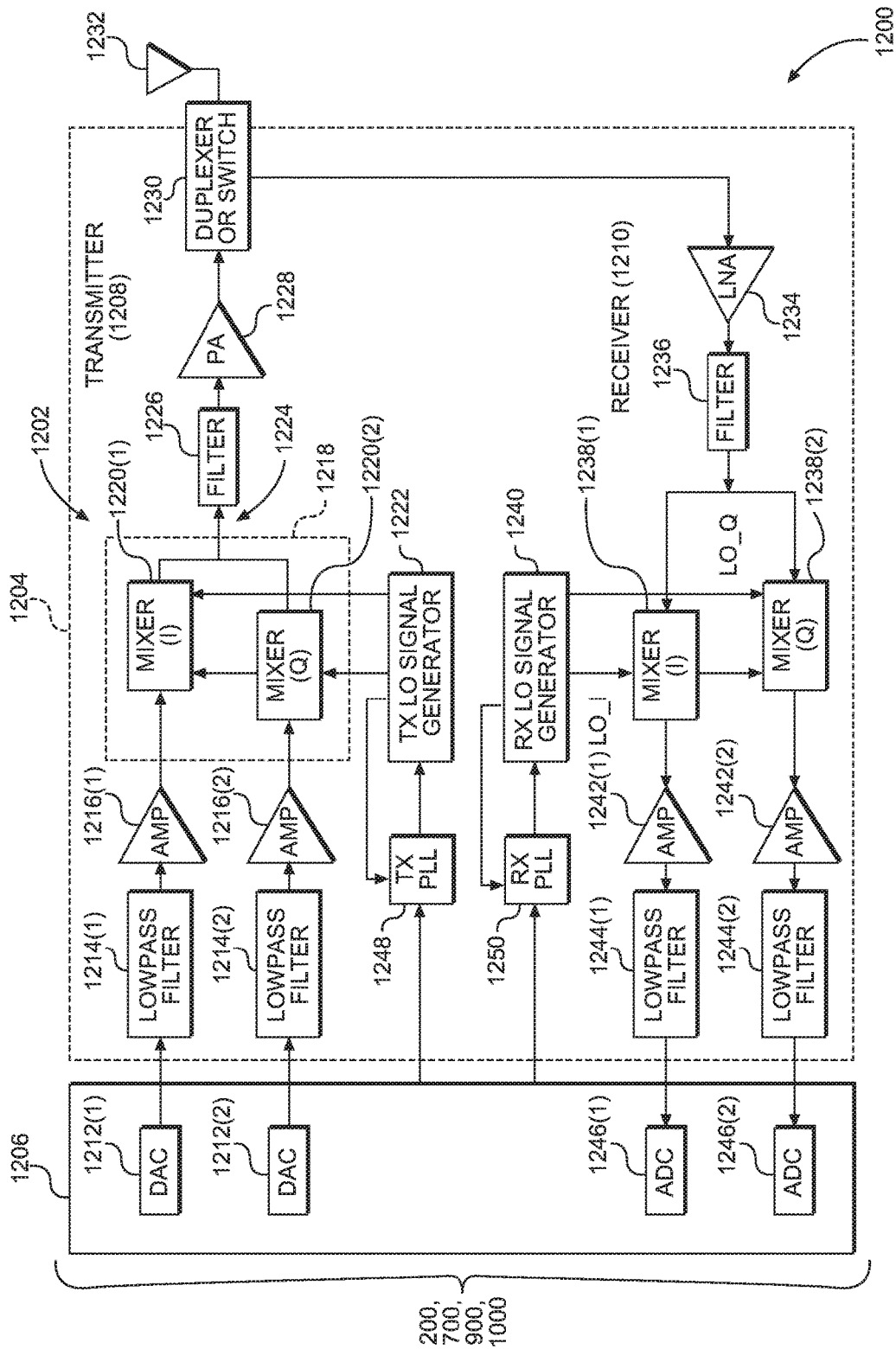
FIG. 12 is a block diagram of an exemplary wireless communications device that includes radio frequency (RF) components formed in an integrated circuit (IC), wherein the RF components can include elements employing the MLC SRAM cell of FIGS. 2A and 2B, and/or the MLC SRAM matrix array multiplication circuits of FIGS. 7, 9, and 10.

FIG. 12 illustrates an exemplary wireless communications device 1200 that includes radio frequency (RF) components formed in an integrated circuit (IC) 1202, wherein the RF components can include elements employing the MLC SRAM cell 200 of FIGS. 2A and 2B, and the MLC SRAM matrix array multiplication circuits 700, 900, and 1000 of FIGS. 7, 9, and 10, respectively. In this regard, the wireless communications device 1200 may be provided in the IC 1202. The wireless communications device 1200 may include or be provided in any of the above referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RF ICs (RFICs), mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMP) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by amplifiers (AMP) 1242(1), 1242(2) and further filtered by lowpass filters 1244(1), 1244(2) to obtain I and Q analog input signals, which are provided to the data processor 1206. In this example, the data processor 1206 includes ADCs 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multi-level cell (MLC) static random access memory (SRAM) (MLC SRAM) cell, comprising:
 a read bit line input node electrically coupled to a read bit line;
 a current sum output node electrically coupled to a current sum line; and
 one or more SRAM bit cells, wherein each SRAM bit cell of the one or more SRAM bit cells comprises:
  a first inverter and a second inverter cross-coupled such that the corresponding SRAM bit cell is configured to store a binary data value;
  an input node electrically coupled to the read bit line input node;
  an output node electrically coupled to the current sum output node; and
  a read port configured to electrically couple the input node and the output node of the corresponding SRAM bit cell such that a voltage on the input node generates a current in the output node in response to the binary data value stored in the cross-coupled first and second inverters.

2. The MLC SRAM cell of claim 1, wherein each SRAM bit cell of the one or more SRAM bit cells further comprises:
 a first access transistor, comprising:
  a first node electrically coupled to a corresponding write bit line;
  a second node electrically coupled to an input node of the first inverter and an output node of the second inverter of the corresponding SRAM bit cell; and
  a gate node electrically coupled to a write word line; and a second access transistor, comprising:
  a first node electrically coupled to an output node of the first inverter and an input node of the second inverter of the corresponding SRAM bit cell;
  a second node electrically coupled to a corresponding complement write bit line; and
  a gate node electrically coupled to the write word line.

3. The MLC SRAM cell of claim 2, wherein the read port of each SRAM bit cell of the one or more SRAM bit cells comprises:
  a first transistor, comprising:
    a first node electrically coupled to the input node of the corresponding SRAM bit cell;
    a second node; and
    a gate node electrically coupled to a read word line; and
  a second transistor, comprising:
    a first node electrically coupled to the second node of the first transistor of the read port;
    a second node electrically coupled to the output node of the corresponding SRAM bit cell; and
    a gate node electrically coupled to the output node of the first inverter of the corresponding SRAM bit cell.

4. The MLC SRAM cell of claim 3, wherein:
the first transistor is an N-type metal-oxide semiconductor (MOS) (NMOS) transistor; and
the second transistor is an NMOS transistor.

5. The MLC SRAM cell of claim 3, wherein:
the first transistor is a P-type MOS (PMOS) transistor; and
the second transistor is an NMOS transistor.

6. The MLC SRAM cell of claim 3, wherein:
the first transistor is an NMOS transistor; and
the second transistor is a PMOS transistor.

7. The MLC SRAM cell of claim 3, wherein:
the first transistor is a PMOS transistor; and
the second transistor is a PMOS transistor.

8. The MLC SRAM cell of claim 2, wherein the read port of each SRAM bit cell of the one or more SRAM bit cells comprises a transistor, comprising:
  a first node electrically coupled to the read bit line input node;
  a second node electrically coupled to the current sum output node; and
  a gate node electrically coupled to the output node of the first inverter of the corresponding SRAM bit cell.

9. The MLC SRAM cell of claim 8, wherein the transistor is an NMOS transistor.

10. The MLC SRAM cell of claim 8, wherein the transistor is a PMOS transistor.

11. The MLC SRAM cell of claim 1, further comprising an analog-to-digital converter (ADC) configured to convert a total current on the current sum output node into a digital output value and comprising:
  an input node electrically coupled to the current sum output node; and
  an output node configured to provide the digital output value.

12. The MLC SRAM cell of claim 1, further comprising a spike sense circuit comprising:
  a capacitor, comprising:
    a first node electrically coupled to the current sum output node; and
    a second node electrically coupled to ground;
  a transistor, comprising:
    a first node electrically coupled to the current sum output node;
    a second node electrically coupled to the second node of the capacitor; and
    a gate node; and
  a comparator, comprising:
    a first input node electrically coupled to a reference voltage supply;
    a second input node electrically coupled to the current sum output node; and
    an output node electrically coupled to the gate node of the transistor.

13. The MLC SRAM cell of claim 1 integrated into an integrated circuit (IC).

14. The MLC SRAM cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

15. A method of using a multi-level cell (MLC) static random access memory (SRAM) (MLC SRAM) cell to multiply a multiple-bit data value stored in the MLC SRAM cell by a multiple-bit value input into the MLC SRAM cell, comprising:
  writing a binary data value to each SRAM bit cell of one or more SRAM bit cells of the MLC SRAM cell, wherein a multiple-bit value of the binary data values written to the one or more SRAM bit cells is a first operand determined based on the binary data value stored in each SRAM bit cell;
  applying a voltage to a read bit line electrically coupled to a read bit line input node of the MLC SRAM cell that is electrically coupled to an input node of each SRAM bit cell of the one or more SRAM bit cells, wherein a magnitude of a multiple-bit value of the voltage correlates to a second operand; and
  combining currents present on each output node of each SRAM bit cell of the one or more SRAM bit cells onto a current sum output node electrically coupled to a current sum line such that a total current on the current sum line has a magnitude correlating to a multiple-bit product of the first operand and the second operand.

16. A multi-level cell (MLC) static random access memory (SRAM) (MLC SRAM) matrix array multiplication circuit, comprising:
  a plurality of MLC SRAM cells organized into a plurality of MLC SRAM cell rows and a plurality of MLC SRAM cell columns, wherein each MLC SRAM cell of the plurality of MLC SRAM cells corresponds to an MLC SRAM cell row and an MLC SRAM cell column, and comprises:
    a read bit line input node;
    a current sum output node; and
    one or more SRAM bit cells, wherein each SRAM bit cell of the one or more SRAM bit cells comprises:
      a first inverter and a second inverter cross-coupled and configured to store a binary data value;

an input node electrically coupled to the read bit line input node of the corresponding MLC SRAM cell;
an output node electrically coupled to the current sum output node of the corresponding MLC SRAM cell; and
a read port configured to electrically couple the input node to the output node of the corresponding SRAM bit cell such that a voltage on the input node generates a current in the output node in response to the binary data value stored in the cross-coupled first and second inverters;
a plurality of read bit lines, wherein each read bit line of the plurality of read bit lines corresponds to an MLC SRAM cell column and is electrically coupled to the read bit line input node of each MLC SRAM cell of the corresponding MLC SRAM cell column; and
a plurality of current sum lines, wherein each current sum line of the plurality of current sum lines corresponds to an MLC SRAM cell row and is electrically coupled to the current sum output node of each MLC SRAM cell of the corresponding MLC SRAM cell row.

17. The MLC SRAM matrix array multiplication circuit of claim 16, wherein each SRAM bit cell of the one or more SRAM bit cells of the plurality of MLC SRAM cells further comprises:
a first access transistor, comprising:
a first node electrically coupled to a corresponding write bit line;
a second node electrically coupled to an input node of the first inverter and an output node of the second inverter of the corresponding SRAM bit cell; and
a gate node electrically coupled to a write word line; and
a second access transistor, comprising:
a first node electrically coupled to an output node of the first inverter and an input node of the second inverter of the corresponding SRAM bit cell;
a second node electrically coupled to a corresponding complement write bit line; and
a gate node electrically coupled to the write word line.

18. The MLC SRAM matrix array multiplication circuit of claim 17, wherein the read port of each SRAM bit cell of the one or more SRAM bit cells of the plurality of MLC SRAM cells comprises:
a first transistor, comprising:
a first node electrically coupled to the input node of the corresponding SRAM bit cell;
a second node; and
a gate node electrically coupled to a read word line; and
a second transistor, comprising:
a first node electrically coupled to the second node of the first transistor of the read port;
a second node electrically coupled to the output node of the corresponding SRAM bit cell; and
a gate node electrically coupled to the output node of the first inverter of the corresponding SRAM bit cell.

19. The MLC SRAM matrix array multiplication circuit of claim 18, wherein:
the first transistor is an N-type metal-oxide semiconductor (MOS) (NMOS) transistor; and
the second transistor is an NMOS transistor.

20. The MLC SRAM matrix array multiplication circuit of claim 18, wherein:
the first transistor is a P-type MOS (PMOS) transistor; and
the second transistor is an NMOS transistor.

21. The MLC SRAM matrix array multiplication circuit of claim 18, wherein:
the first transistor is a PMOS transistor; and
the second transistor is a PMOS transistor.

22. The MLC SRAM matrix array multiplication circuit of claim 18, wherein:
the first transistor is an NMOS transistor; and
the second transistor is a PMOS transistor.

23. The MLC SRAM matrix array multiplication circuit of claim 17, wherein the read port of each SRAM bit cell of the one or more SRAM bit cells of the plurality of MLC SRAM cells comprises a transistor comprising:
a first node electrically coupled to the input node of the corresponding SRAM bit cell;
a second node electrically coupled to the output node of the corresponding SRAM bit cell; and
a gate node electrically coupled to the output node of the first inverter of the corresponding SRAM bit cell.

24. The MLC SRAM matrix array multiplication circuit of claim 23, wherein the transistor is an NMOS transistor.

25. The MLC SRAM matrix array multiplication circuit of claim 23, wherein the transistor is a PMOS transistor.

26. The MLC SRAM matrix array multiplication circuit of claim 16, further comprising a plurality of analog-to-digital converters (ADCs), wherein each ADC is configured to convert a total current on a corresponding current sum line of the plurality of current sum lines into a digital output value and comprises:
an input node electrically coupled to the current sum output node of each MLC SRAM cell of the corresponding MLC SRAM cell row; and
an output node configured to provide the digital output value.

27. The MLC SRAM matrix array multiplication circuit of claim 16, further comprising a plurality of spike sense circuits, wherein each spike sense circuit of the plurality of spike sense circuits corresponds to a current sum line of the plurality of current sum lines and comprises:
a capacitor, comprising:
a first node electrically coupled to the current sum output node of each MLC SRAM cell of the corresponding MLC SRAM cell row; and
a second node electrically coupled to ground;
a transistor, comprising:
a first node electrically coupled to the current sum output node of each MLC SRAM cell of the corresponding MLC SRAM cell row;
a second node electrically coupled to the second node of the capacitor; and
a gate node; and
a comparator, comprising:
a first input node electrically coupled to a reference voltage supply;
a second input node electrically coupled to the current sum output node of each MLC SRAM cell of the corresponding MLC SRAM cell row; and
an output node electrically coupled to the gate node of the transistor.

28. A method of using a multi-level cell (MLC) static random access memory (SRAM) (MLC SRAM) matrix array multiplication circuit to multiply matrices, comprising:
writing a binary data value to each SRAM bit cell of one or more SRAM bit cells of each MLC SRAM cell of a plurality of MLC SRAM cells organized into a plurality of MLC SRAM cell rows and a plurality of MLC SRAM cell columns, wherein each MLC SRAM cell of the plurality of MLC SRAM cells corresponds to an MLC SRAM cell row and an MLC SRAM cell column and a multiple-bit data value stored in each MLC SRAM cell correlates to a first operand determined based on the binary data value stored in each SRAM bit cell;

applying a plurality of voltages to a corresponding plurality of read bit lines, wherein each read bit line of the plurality of read bit lines corresponds to an MLC SRAM cell column and is electrically coupled to a read bit line input node of each MLC SRAM cell of the corresponding MLC SRAM cell column that is coupled to an input node of each SRAM bit cell of each corresponding MLC SRAM cell, and a magnitude of each voltage correlates to a second operand corresponding to a multiple-bit value of an entry in a matrix array; and for each iteration of applying the plurality of voltages, combining currents present on each output node of each SRAM bit cell of the one or more SRAM bit cells onto a current sum output node of the corresponding MLC SRAM cell of the corresponding MLC SRAM cell row electrically coupled to a current sum line such that a total current on a corresponding current sum line has a magnitude corresponding to a summation of each multiple-bit product of each corresponding first operand and each corresponding second operand.

\* \* \* \* \*